United States Patent
Pfannenmüller et al.

(10) Patent No.: US 12,283,936 B2
(45) Date of Patent: *Apr. 22, 2025

(54) DUPLEXER MEASUREMENT AND TUNING SYSTEMS

(71) Applicant: Apple Inc., Cupertino, CA (US)

(72) Inventors: Christof Pfannenmüller, Erlangen (DE); Dominic Koehler, Viereth-Trunstadt (DE); Julian W Zuber, Erlangen (DE); Oliver Georg Dorn, Erlangen (DE); Bjoern Lenhart, Nuremberg (DE); Harald Pretl, Schwertberg (AT); Rastislav Vazny, Sunnyvale, CA (US); Christian F Tanzer, Perlesreut (DE)

(73) Assignee: Apple Inc., Cupertino, CA (US)

( * ) Notice: Subject to any disclaimer, the term of this patent is extended or adjusted under 35 U.S.C. 154(b) by 227 days.

This patent is subject to a terminal disclaimer.

(21) Appl. No.: 17/939,616

(22) Filed: Sep. 7, 2022

(65) Prior Publication Data

US 2024/0080008 A1  Mar. 7, 2024

(51) Int. Cl.
  *H04B 1/10* (2006.01)
  *H03H 7/48* (2006.01)
  *H04B 1/40* (2015.01)

(52) U.S. Cl.
  CPC ........... *H03H 7/487* (2013.01); *H04B 1/1027* (2013.01); *H04B 1/40* (2013.01)

(58) Field of Classification Search
  CPC .. H03H 7/01; H03H 7/46; H03H 7/48; H03H 7/487; H03H 9/25; H04B 1/00; H04B 1/04; H04B 1/10; H04B 1/12; H04B 1/16; H04B 1/40; H04B 1/50; H04B 1/52; H04B 1/62; H04B 1/525; H04B 1/1027; H04B 1/3805; H04B 7/26; H04B 17/00; H04L 5/14; H04L 27/26; H04W 24/08; H04W 52/08; H04W 88/02
  USPC ........................ 375/219, 260, 295–297, 316; 370/277–278
  See application file for complete search history.

(56) References Cited

U.S. PATENT DOCUMENTS

| | | | |
|---|---|---|---|
| 2013/0083703 A1* | 4/2013 | Granger-Jones | H03H 7/463 370/277 |
| 2013/0241670 A1* | 9/2013 | Mikhemar | H04B 1/18 333/126 |
| 2022/0329273 A1* | 10/2022 | Pehlke | H03H 9/725 |

* cited by examiner

Primary Examiner — Shawkat M Ali
(74) Attorney, Agent, or Firm — FLETCHER YODER PC

(57) ABSTRACT

Systems and methods combine a test signal with a wanted (downlink or uplink) signal at an input of a duplexer of a communication device, and receive the test signal at an output of the duplexer. The test signal may include a radio frequency signal having less power than the wanted signal to avoid interference, or a digital signal that is added to or extracted from the wanted signal when the wanted signal does not have a radio frequency. A processor of the communication device causes the duplexer to operate in a tuning state (e.g., to transmit signals having a transmission frequency and receive signals having a receive frequency). The measurement system determines a difference or ratio in power between the test signal at the duplexer output and the duplexer input, and adjusts the tuning state based on the difference or ratio (e.g., to decrease or minimize the difference or ratio).

20 Claims, 14 Drawing Sheets

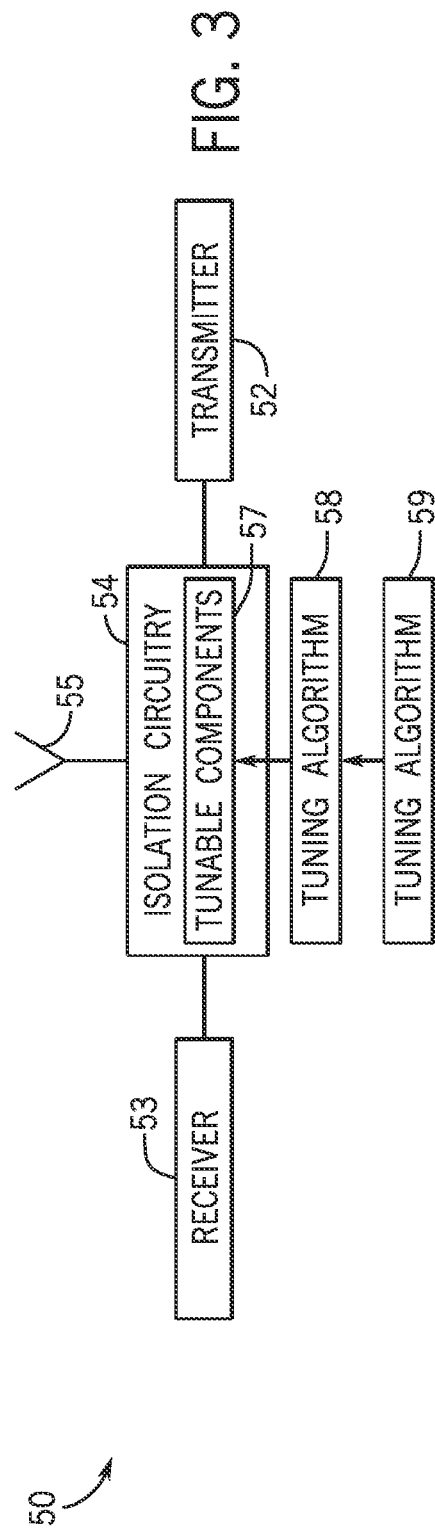
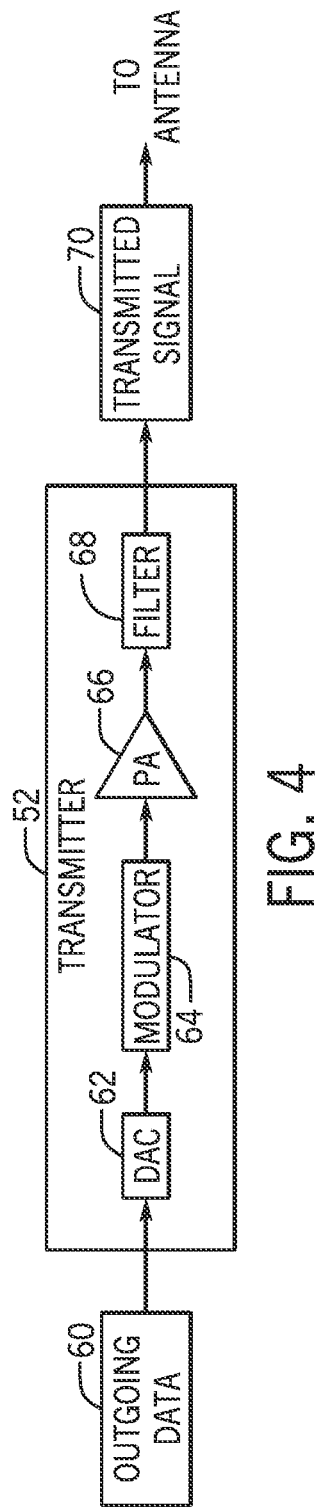
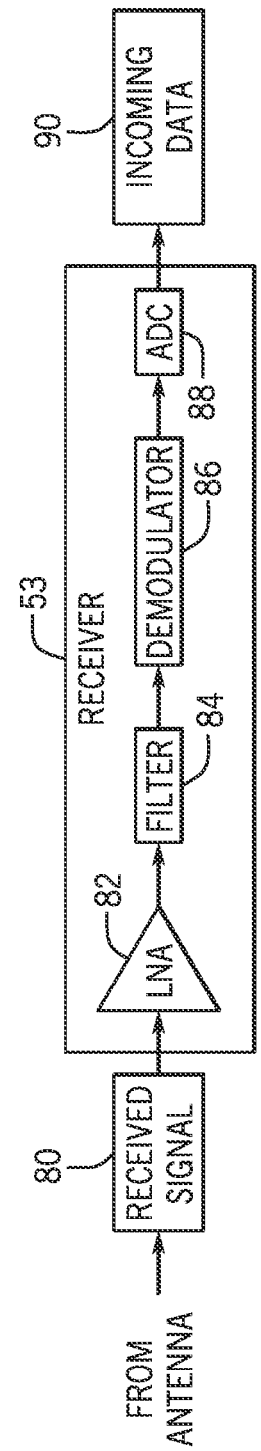

DUPLEXER MEASUREMENT AND TUNING SYSTEMS

BACKGROUND

The present disclosure relates generally to wireless communication, and more specifically to isolation of wireless signals between transmitters and receivers in wireless communication devices.

In an electronic device, a transmitter and a receiver may each be coupled to one or more antennas to enable the electronic device to both transmit and receive wireless signals. The electronic device may include a duplexer that isolates the transmitter from received signals of a first frequency range, and isolates the receiver from transmission signals of a second frequency range (e.g., thus implementing frequency division duplex (FDD) operations). In this manner, interference between the transmission and received signals may be reduced when communicating using the electronic device. However, these communications may be negatively impacted by insertion loss resulting from components of the duplexer providing less than ideal isolation of the transmission and/or received signals.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, an electronic device includes a memory storing a tuning state, an antenna that receives a first signal, a receiver, a duplexer including a tunable component having multiple tuning states, a combiner coupled to the antenna and the duplexer, a splitter coupled to the duplexer and the receiver, and a processor coupled to the combiner and the splitter. The processor combines a second signal with the downlink signal at the combiner to generate a combined signal, receives the combined signal at the splitter, and adjusts the tuning state based on the combined signal.

In another embodiment, a method includes configuring, via processing circuitry, a tunable component of a duplexer with a tuning state. The method also includes combining, at an input of the duplexer, a first signal with a second signal to generate a combined signal. The method further includes receiving, at an output of the duplexer, the combined signal. The method also includes adjusting, via the processing circuitry, the tuning state based on the combined signal.

In yet another embodiment, a radio frequency front end includes an antenna, a transmitter that transmits a first signal, a duplexer including a tunable component having multiple tuning states, a combiner coupled the transmitter and the duplexer, a splitter coupled to the duplexer and the antenna, and a processor coupled to the combiner and the splitter. The processor combines a second signal with the first signal at the combiner to generate a combined signal, receives the combined signal at the splitter, and adjusts the tunable component based on the combined signal.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

FIG. 3 is a schematic diagram of a radio frequency front end (RFFE) of the electronic device of FIG. 1 having isolation circuitry that isolates a transmitter of FIG. 2 from received signals of a first frequency range, and isolates a receiver of FIG. 2 from transmission signals of a second frequency range, according to embodiments of the present disclosure;

FIG. 4 is a schematic diagram of a transmitter of the electronic device of FIG. 1, according to embodiments of the present disclosure;

FIG. 5 is a schematic diagram of a receiver of the electronic device of FIG. 1, according to embodiments of the present disclosure;

DETAILED DESCRIPTION OF SPECIFIC EMBODIMENTS

Figure 1:
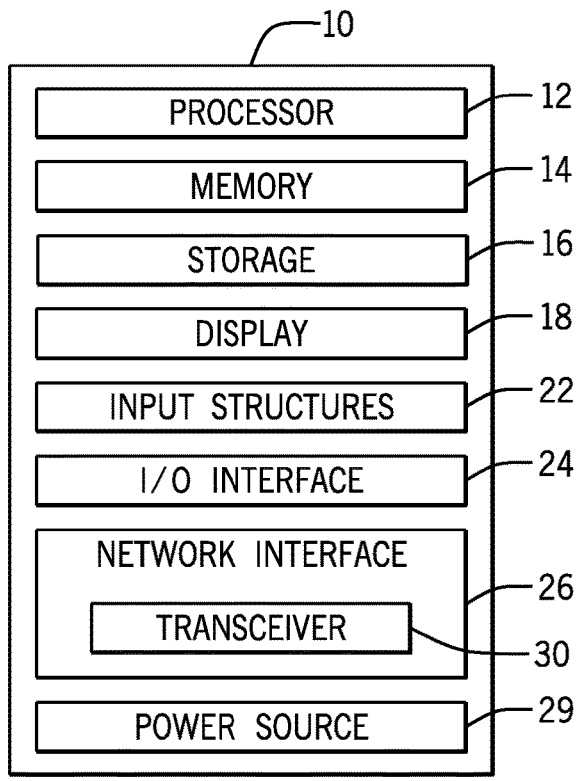
FIG. 1 is a block diagram of an electronic device, according to embodiments of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on. Additionally, the term "set" may include one or more. That is, a set may include a unitary set of one member, but the set may also include a set of multiple members.

This disclosure is directed to isolating wireless signals between a transmitter and a receiver in a wireless communication device using a duplexer (e.g., an electrical balanced duplexer (EBD), a phase balanced duplexer (PBD), Wheatstone balanced duplexer (WBD), a double balanced duplexer (DBD), a circular balanced duplexer (CBD), or any other duplexer used to isolate wireless signals between transmitters and receivers). A tunable duplexer includes components that may be adjusted or tuned (e.g., phase shifters and/or impedance tuners) to alter isolation performance and insertion loss (e.g., loss resulting from the components of the duplexer providing less than ideal isolation of the transmission and/or received signals) between the transmitter, the receiver, and/or one or more antennas coupled to the transmitter and the receiver.

In particular, these tunable components may be tuned or adjusted to different tuning states to enable the transmitter to transmit and/or the receiver to receive signals over different frequencies and bandwidths (enabling multi-band tenability). The tuning states may be stored in, and/or received or retrieved from a data structure (e.g., a lookup table) of the device, generated via a machine-learning model, a tuning algorithm, a state machine, a control loop, and so on. Each tuning state may provide a different isolation and insertion loss (e.g., different key performance indicators). It may be desired to determine a tuning state for given transmission and receive frequencies that enable better or the best isolation performance (e.g., the highest isolation, approaching infinite isolation) and better or the best insertion loss (e.g., the least insertion loss, zero decibel (dB) insertion loss). However, it may be difficult to measure the isolation and insertion loss performance, as a measurement system of the communication device may combine test or measurement signals (e.g., pilot tones) used for measurement with "wanted" transmission or receive signals, and, because the test signals may have similar frequencies and/or power as the transmission and receive signals, the signals may interfere with each other, resulting in inaccurate measurement or destruction of the wanted signals, thus impairing or preventing further usage of the wanted signals.

Systems and methods are disclosed that combine a test signal with a wanted signal at an input of a duplexer of a communication device, and receive the test signal at an output of the duplexer. It should be understood that any input of the duplexer may be treated as an output of the duplexer, and vice versa. As such, a measurement system that generates the test signal may be external to the duplexer. The measurement system may be coupled to the duplexer input at a first node shared by one of a receiver, a transmitter, or an antenna of the communication device, and coupled to the duplexer output at a second node shared by another one, or even the same one, of the receiver, the transmitter, or the antenna. As such, the test signal may include a radio frequency signal having less power than the wanted signal to avoid interference, but a same or similar frequency as the wanted signal. In additional or alternative embodiments, the test signal may include a digital signal (e.g., in-phase and/or quadrature signals) that is added to or extracted from the wanted signal when the wanted signal does not have a radio frequency (e.g., has a baseband or intermediate frequency). A processor of the communication device may cause the duplexer to operate in a tuning state (e.g., to transmit signals having a transmission frequency and receive signals having a receive frequency). The measurement system may determine a difference (e.g., a power difference) between the test signal at the duplexer output and the duplexer input, and adjust the tuning state based on the difference (e.g., to decrease or minimize the difference), as the difference indicates isolation or insertion loss performance of the duplexer.

In some embodiments, the measurement system may include a transmitter, a receiver, or a transceiver (having both the transmitter and the receiver) having one or more amplifiers (e.g., one or more power amplifiers, a low noise amplifier) to amplify the test signal. In one embodiment, the measurement system may include averaging logic (e.g., software, hardware, or both) that increases power (e.g., greater than the wanted signal) of the test signal by averaging multiple measurements of a signal combining the test signal and the wanted signal. This may enable the measurement system to more easily detect and extract the test signal from the combined signal.

In some embodiments, the measurement system may include code spreading logic (e.g., software, hardware, or both) that applies code spreading (e.g., via a pseudo-random code, such as Gold code, Walsh code, or any other code-division multiple access (CDMA) code or pseudo-random noise sequence) to the test signal prior to combining with the wanted signal, causing the test signal to be spread over a wider bandwidth having lower power compared to the wanted signal. The measurement system may also include code de-spreading logic that applies code de-spreading to the combined signal, which may cause the test signal to de-spread over a narrower bandwidth having higher power and cause the wanted signal to spread over a wider bandwidth having lower power. The measurement system may then more easily detect and extract the test signal from the combined signal.

In additional or alternative embodiments, the test signal may include an orthogonal frequency-division modulation (OFDM) signal. Advantageously, the OFDM signal may include multiple tones that are independent and may be combined without interference. Moreover, because the OFDM signal is similar to certain cellular signals (e.g., fourth generation (4G) or fifth generation (5G) cellular signals), the communication device may implement the OFDM signal as the test signal without additional or with minimal additional hardware or logic. In particular, the test signal may prevent the multiple, individual tones from interfering with one another.

In this manner, the disclosed systems and methods may measure performance (e.g., isolation and insertion loss) of a duplexer of a communication device, while avoiding inaccuracies caused by interference between test signals and wanted transmission and/or receive signals, and adjust tuning states of the duplexer in real-time (e.g., while the communication device is in operation). In particular, the disclosed systems and methods may measure the performance of the duplexer and dynamically provide tuning state adjustments based on real-time measurements (which may reflect changes in operation of the communication device due to aging of components, obstructions to the antenna, signal quality or power changes, and so on).

With the foregoing in mind, FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 22, an input/output (I/O) interface 24, a network interface 26, and a power source 29. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 22, the input/output (I/O) interface 24, the network interface 26, and/or the power source 29 may each be communicatively coupled directly or indirectly (e.g., through or via another component, a communication bus, a network) to one another to transmit and/or receive signals between one another. It should be noted that FIG. 1 is merely one example of a particular implementation and is intended to illustrate the types of components that may be present in the electronic device 10.

By way of example, the electronic device 10 may include any suitable computing device, including a desktop or notebook computer (e.g., in the form of a MacBook®, MacBook® Pro, MacBook Air®, iMac®, Mac® mini, or Mac Pro® available from Apple Inc. of Cupertino, California), a portable electronic or handheld electronic device such as a wireless electronic device or smartphone (e.g., in the form of a model of an iPhone® available from Apple Inc. of Cupertino, California), a tablet (e.g., in the form of a model of an iPad® available from Apple Inc. of Cupertino, California), a wearable electronic device (e.g., in the form of an Apple Watch® by Apple Inc. of Cupertino, California), and other similar devices. It should be noted that the processor 12 and other related items in FIG. 1 may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. In some embodiments, the I/O interface 24 may include an I/O port for a hardwired connection for charging and/or content manipulation using a standard connector and protocol, such as the Lightning connector provided by Apple Inc. of Cupertino, California, a universal serial bus (USB), or other similar connector and protocol. The network interface 26 may include, for example, one or more interfaces for a personal area network (PAN), such as an ultra-wideband (UWB) or a BLUETOOTH® network, a local area network (LAN) or wireless local area network (WLAN), such as a network employing one of the IEEE 802.11x family of protocols (e.g., WI-FI®), and/or a wide area network (WAN), such as any standards related to the Third Generation Partnership Project (3GPP), including, for example, a $3^{rd}$ generation (3G) cellular network, universal mobile telecommunication system (UMTS), $4^{th}$ generation (4G) cellular network, long term evolution (LTE®) cellular network, long term evolution license assisted access (LTE-LAA) cellular network, $5^{th}$ generation (5G) cellular network, and/or New Radio (NR) cellular network, a $6^{th}$ generation (6G) or greater than 6G cellular network, a satellite network, a non-terrestrial network, and so on. In particular, the network interface 26 may include, for example, one or more interfaces for using a cellular communication standard of the 5G specifications that include the millimeter wave (mm-Wave) frequency range (e.g., 24.25-300 gigahertz (GHz)) that defines and/or enables frequency ranges used for wireless communication. The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 26 may include a transceiver 30. In some embodiments, all or portions of the transceiver 30 may be disposed within the processor 12. The transceiver 30 may support transmission and receipt of various wireless signals via one or more antennas, and thus may include a transmitter and a receiver. The power source 29 of the electronic device 10 may include any suitable source of power, such as a rechargeable lithium polymer (Li-poly) battery and/or an alternating current (AC) power converter.

Figure 2:
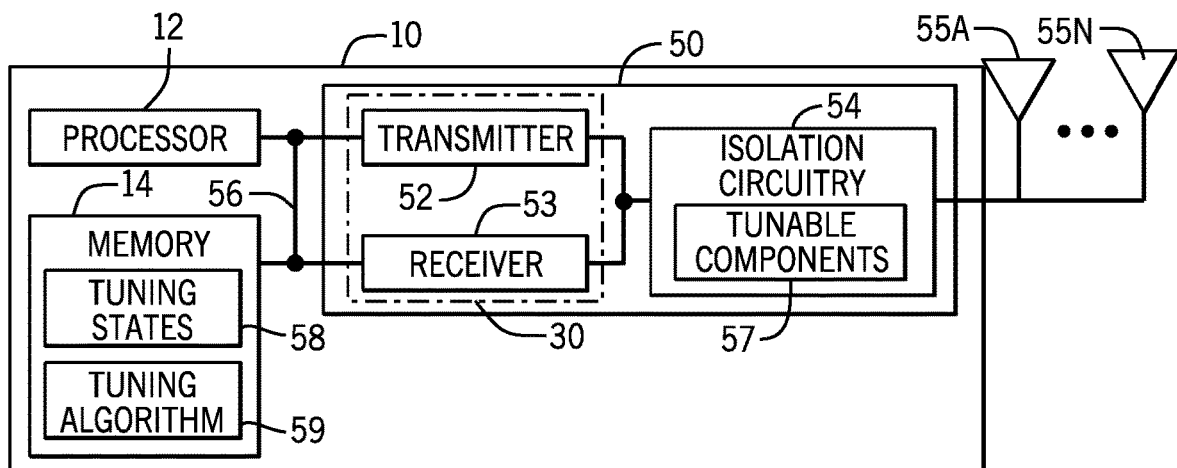
FIG. 2 is a functional diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, a radio frequency front end (RFFE) 50 having the transceiver 30, which includes a transmitter 52 and a receiver 53, and isolation circuitry 54, and/or antennas 55 (illustrated as 55A-55N, collectively referred to as an antenna 55) may be communicatively coupled directly or indirectly (e.g., through or via another component, a communication bus, a network) to one another to transmit and/or receive signals between one another.

The transmitter 52 and/or the receiver 53 may respectively enable transmission and reception of signals between the electronic device 10 and an external device via, for example, a network (e.g., including base stations or access points) or a direct connection. As illustrated, the transmitter 52 and the receiver 53 may be combined into the transceiver 30. The electronic device 10 may also have one or more antennas 55A-55N electrically coupled to the transceiver 30 via the isolation circuitry 54. The antennas 55A-55N may be configured in an omnidirectional or directional configuration, in a single-beam, dual-beam, or multi-beam arrangement, and so on. Each antenna 55 may be associated with a one or more beams and various configurations. In some embodiments, multiple antennas of the antennas 55A-55N of an antenna group or module may be communicatively coupled a respective transceiver 30 and each emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 52 and the receiver 53 may transmit and receive information via other wired or wireline systems or means.

The RFFE 50 may include components of the electronic device 10 that receive as input, output, and/or process signals having radio frequency, including at least some components (e.g., the power amplifier 66, the filter 68) of the transmitter 52, at least some components (e.g., the low noise amplifier 82, the filter 84) of receiver 53, and the isolation circuitry 54. As illustrated, the isolation circuitry 54 is communicatively coupled between the transmitter 52 and the receiver 53, as well as the one or more antennas 55. The isolation circuitry 54 enables signals (e.g., transmission signals) of a first frequency range from the transmitter 52 to pass through to the one or more antennas 55 and blocks the signals of the first frequency range from passing through to the receiver 53. The isolation circuitry 54 also enables signals (e.g., received signals) of a second frequency range received via the one or more antennas 55 to pass through to the receiver 53 and blocks the received signals of the second frequency range from passing through to the transmitter 52. Each frequency range may be of any suitable bandwidth, such as between 0 and 100 gigahertz (GHz) (e.g., 10 megahertz (MHz)), and include any suitable frequencies. For example, the first frequency range (e.g., a transmit frequency range) may be between 880 and 890 MHz, and the second frequency range (e.g., a receive frequency range) may be between 925 and 936 MHz.

As illustrated, the various components of the electronic device 10 may be coupled together by a bus system 56. The bus system 56 may include a data bus, for example, as well as a power bus, a control signal bus, and a status signal bus, in addition to the data bus. The components of the electronic device 10 may be coupled together or accept or provide inputs to each other using some other mechanism.

The isolation circuitry 54 may include tunable components 57 that may be adjusted or tuned, such as impedance tuners and/or phase shifters (e.g., including variable resistive devices such as variable resistors, variable inductive devices such as variable inductors, variable capacitive devices such as variable capacitors, and so on) to alter isolation performance and insertion loss (e.g., loss resulting from the components of the isolation circuitry 54 between the transmitter 52, the receiver 53, and/or the antenna 55). In particular, the processor 12 may adjust or tune the tunable components 57 based on tuning states 58 stored in the memory 14 and/or the storage 16. The tuning states 58 may include different configurations of the tunable components 57 stored in a data structure saved in the memory 14 that enable a target isolation range and target insertion loss range associated with the transmitter 52, the receiver 53, and/or the antenna 55. A tuning algorithm 59, which may also be stored in the memory 14 and/or the storage 16, and be executed by the processor 12, may include one or more algorithms that, when performed, enable the processor 12 to adjust the tuning states 58 to better achieve the target isolation range and target insertion loss range associated with the transmitter 52, the receiver 53, and/or the antenna 55.

FIG. 3 is a schematic diagram of the RFFE 50 of the electronic device 10, according to embodiments of the present disclosure. As described above, the RFFE 50 includes the isolation circuitry 54 that isolates the transmitter 52 from received signals of a first frequency range, and isolates the receiver 53 from transmission signals of a second frequency range. Due to a non-ideal nature of components of the isolation circuitry 54, when isolating the receiver 53 from a transmission signal generated by the transmitter 52, some of the transmission signal (e.g., a transmit leakage signal) may propagate toward the receiver 53. If a frequency of the transmit leakage signal is within the receive frequency range (e.g., is a frequency supported by the receiver 53), the transmit leakage signal may interfere with a receive signal and/or the receiver 53. Similarly, when isolating the transmitter 52 from a received signal received via the one or more antennas 55, some of the received signal (e.g., a receive leakage signal) may propagate toward the transmitter 52. If a frequency of the receive leakage signal is within the transmit frequency range (e.g., is a frequency supported by the transmitter 52), the receive leakage signal may interfere with the transmit signal and/or the transmitter 52. These leakage signals may be referred to as insertion loss.

FIG. 4 is a schematic diagram of the transmitter 52 (e.g., transmit circuitry), according to embodiments of the present disclosure. As illustrated, the transmitter 52 may receive outgoing data 60 in the form of a digital signal to be transmitted via the one or more antennas 55. A digital-to-analog converter (DAC) 62 of the transmitter 52 may convert the digital signal to an analog signal, and a modulator 64 may combine the converted analog signal with a carrier signal to generate a radio wave. A power amplifier (PA) 66 receives the modulated signal from the modulator 64. The power amplifier 66 may amplify the modulated signal to a suitable level to drive transmission of the signal via the one or more antennas 55. A filter 68 (e.g., filter circuitry and/or software) of the transmitter 52 may then remove undesirable noise from the amplified signal to generate transmitted signal 70 to be transmitted via the one or more antennas 55. The filter 68 may include any suitable filter or filters to remove the undesirable noise from the amplified signal, such as a bandpass filter, a bandstop filter, a low pass filter, a high pass filter, and/or a decimation filter.

The power amplifier 66 and/or the filter 68 may be referred to as part of a radio frequency front end (RFFE) 69, and more specifically, a transmit front end (TXFE) of the electronic device 10. Additionally, the transmitter 52 may include any suitable additional components not shown, or may not include certain of the illustrated components, such that the transmitter 52 may transmit the outgoing data 60 via the one or more antennas 55. For example, the transmitter 52 may include a mixer and/or a digital up converter. As another example, the transmitter 52 may not include the filter 68 if the power amplifier 66 outputs the amplified signal in or approximately in a desired frequency range (such that filtering of the amplified signal may be unnecessary).

FIG. 5 is a schematic diagram of the receiver 53 (e.g., receive circuitry), according to embodiments of the present disclosure. As illustrated, the receiver 53 may receive received signal 80 from the one or more antennas 55 in the form of an analog signal. A low noise amplifier (LNA) 82 may amplify the received analog signal to a suitable level for the receiver 53 to process. A filter 84 (e.g., filter circuitry and/or software) may remove undesired noise from the received signal, such as cross-channel interference. The filter 84 may also remove additional signals received by the one or more antennas 55 that are at frequencies other than the desired signal. The filter 84 may include any suitable filter or filters to remove the undesired noise or signals from the received signal, such as a bandpass filter, a bandstop filter, a low pass filter, a high pass filter, and/or a decimation filter. The low noise amplifier 82 and/or the filter 84 may be referred to as part of the RFFE 69, and more specifically, a receiver front end (RXFE) of the electronic device 10.

A demodulator 86 may remove a radio frequency envelope and/or extract a demodulated signal from the filtered signal for processing. An analog-to-digital converter (ADC) 88 may receive the demodulated analog signal and convert the signal to a digital signal of incoming data 90 to be further processed by the electronic device 10. Additionally, the receiver 53 may include any suitable additional components not shown, or may not include certain of the illustrated components, such that the receiver 53 may receive the received signal 80 via the one or more antennas 55. For example, the receiver 53 may include a mixer and/or a digital down converter.

Figure 6:
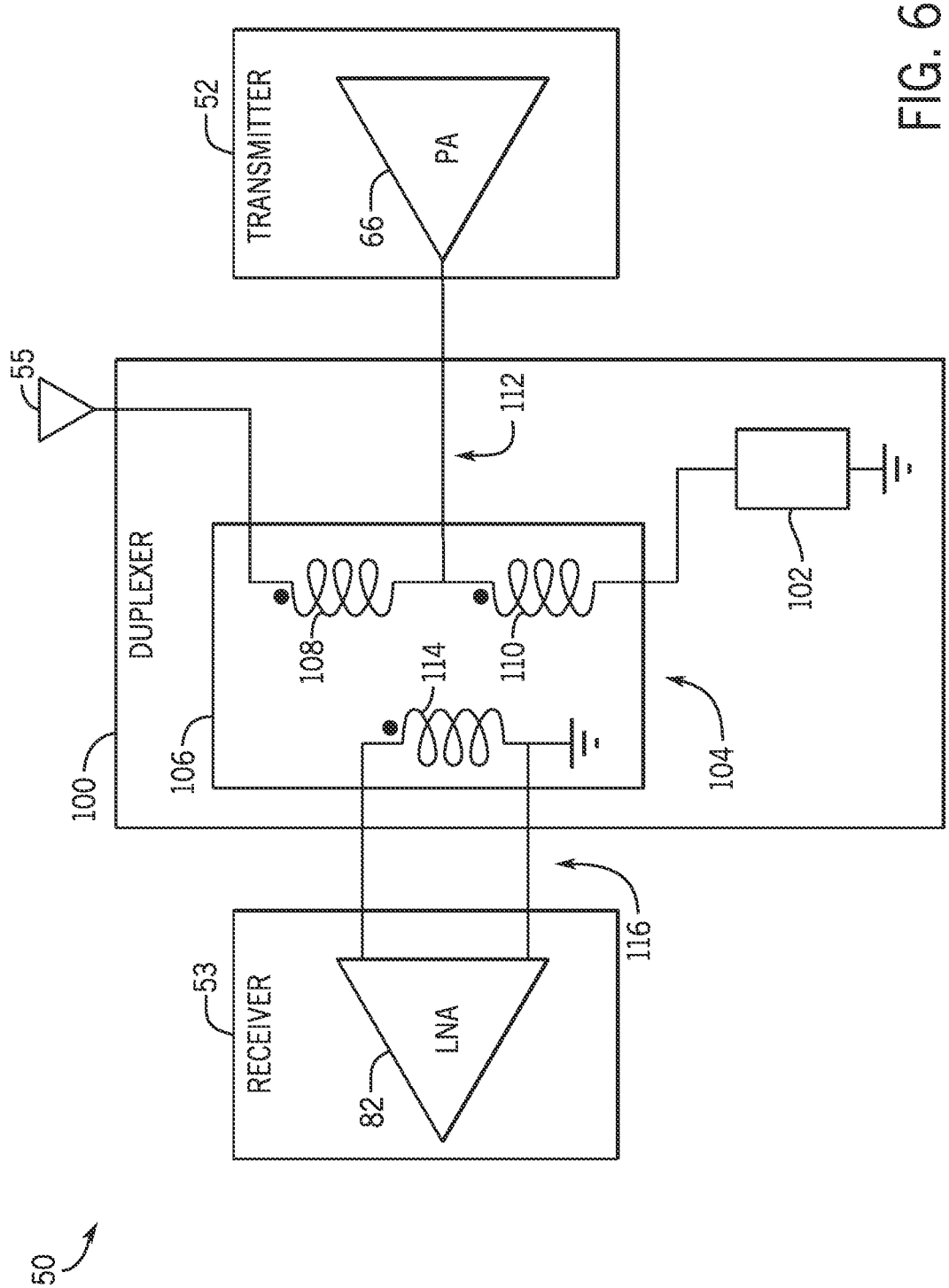
FIG. 6 is a circuit diagram of the RFFE of FIG. 3 having a duplexer of the electronic device of FIG. 1 that isolates the transmitter of FIG. 4 from received signals of a first frequency range, and isolates the receiver of FIG. 5 from transmission signals of a second frequency range, according to embodiments of the present disclosure.

FIG. 6 is a circuit diagram of the RFFE 50 having a duplexer 100 that isolates the transmitter 52 from received signals of a first frequency range, and isolates the receiver 53 from transmission signals of a second frequency range, according to embodiments of the present disclosure. The duplexer 100 may be an example of the isolation circuitry 54, and is illustrated as an electrical balanced duplexer, though the isolation circuitry 54 may include any suitable duplexer used to isolates wireless signals between the transmitter 52 and the receiver 53, such as a phase balanced duplexer (PBD), Wheatstone balanced duplexer (WBD), a double balanced duplexer (DBD), a circular balanced duplexer (CBD), and so on.

The electrical balancer duplexer 100 may use electrical balancing in hybrid junctions to isolate wireless signals between the transmitter 52 and the receiver 53. As shown, a power amplifier (PA) 66 of the transmitter 52, a low noise amplifier (LNA) 82 of the receiver 53, one or more antennas 55, and an impedance tuner 102, may each be connected to different terminals of a four-port hybrid junction 104. Isolation between the transmitter 52 and the receiver 53 may be increased or achieved when an impedance of the impedance tuner 102 and an impedance of the antenna(s) 55 are the same. The impedance tuner 102 may include the tunable components 57 described above with respect to FIGS. 2 and 3. The duplexer 100 includes a hybrid transformer 106, formed with a first inductor 108 and second inductor 110 coupled to the antenna(s) 55. This portion of the hybrid transformer 106 may make up a transmitter port 112. A third inductor 114 may be magnetically coupled to the first and second inductors 108, 110 of the hybrid transformer 106, and this portion of the hybrid transformer 106 may make up a receiver port 116. The hybrid transformer 106 may couple the transmitter 52 and the receiver 53 to the antenna(s) 55 while maintaining a level of isolation between the power amplifier 66 and low noise amplifier 82.

As another example, in the case where the duplexer 100 is a phase-balanced duplexer instead of the electrical-balanced duplexer, one or more phase shifters having the tunable components 57 may be adjusted to perform isolation between the transmitter 52 and the receiver 53, instead of the impedance tuner 102. Similarly, for other types of duplexers (e.g., a Wheatstone balanced duplexer, a double balanced duplexer, a circular balanced duplexer), other adjustable devices may be used to perform isolation between the transmitter 52 and the receiver 53 that may include the tunable components 57.

However, insertion loss may occur from transmission signals transmitted from the transmitter 52 to the antenna(s) 55 leaking into the receiver 53 and/or received signals received at the antenna(s) leaking to the transmitter 52, due to components (e.g., the impedance tuner 102, phase shifters, or the like) of the duplexer 100 not acting in an ideal or as-designed manner. This may be due to environmental factors (e.g., temperature surrounding the electronic device 10, obstructions to the antenna(s)), age of the duplexer 100, manufacturing imperfections of the components of the duplexer 100, and so on. The duplexer 100 may be tunable, such that certain components of the duplexer 100, such as the tunable components 57 of the impedance tuner 102, may be adjusted or tuned to alter isolation performance and insertion loss, thus compensating for non-ideal behavior of the components.

However, it may be difficult to measure the isolation and insertion loss performance (e.g., key performance indicators) of the duplexer 100, as a measurement system of the electronic device 10 may combine test or measurement signals (e.g., pilot tones) used for measurement with "wanted" transmission (e.g., uplink) or receive (e.g., downlink) signals, and, because the test signals may have similar frequencies and/or power as the transmission and receive signals, the signals may interfere with each other, resulting in inaccurate measurement or unusability of the wanted signal. In particular, measurement may occur for each tuning state 58 of the tunable components 57. And not only should the measurement system be in operation when testing or manufacturing the electronic device 10, but also as the electronic device 10 is in operation (e.g., when a user uses the electronic device 10). For example, it is desirable for the measurement system to determine the key performance indicators as the electronic device 10 is in use, as the key performance indicators may change over time (e.g., due to aging or imperfections of components of the electronic device 10) or in real-time (e.g., due to environmental factors such as temperature, obstruction of the antenna 55 due to real world objects, such as trees, buildings, a body part of the user, and so on), and adjusting the tuning state 58 of the tunable components 57 (e.g., by the tuning algorithm 59) may enable better isolation and insertion loss, and thus better communication performance and user experience.

As such, the electronic device 10 may be in use, and, more particularly, transmitting signals having a transmission frequency and receiving signals having a receive frequency, to place the tunable components 57 in a tuning state 58. Ideally, the test signal may mimic or copy these wanted signals in both frequency and power, while the tunable components 57 are in the tuning state 58, as the measurement system should measure how the electronic device 10 actually operates. The measurement system may then determine a difference (e.g., a power difference) of the test signal as it is originally input and as measured, to determine the key performance indicators, and the tuning algorithm 59 may adjust the tuning state 58 based on the difference. However, if the test signal is the same in both frequency and power as a wanted signal, there may be interference between the two signals. It is undesirable for measurement of the key performance indicators of the duplexer 100 to interfere with these wanted signals, as that would impair communication performance of the electronic device 10, and negatively impact user experience. Moreover, it would be undesirable for the wanted signals to impair the test signals, as this may result in inaccurate measurements of the key performance indicators.

Figure 7:
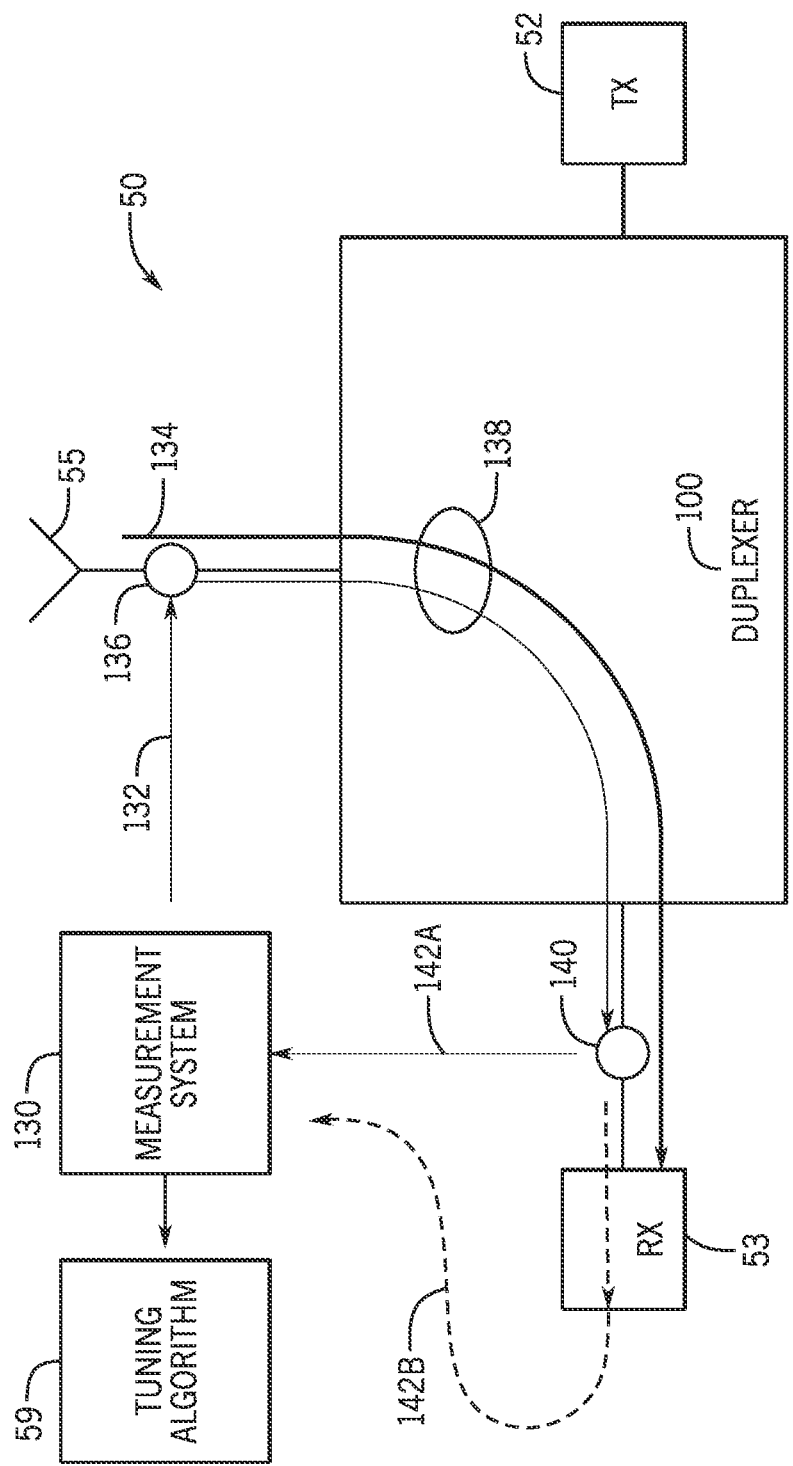
FIG. 7 is a schematic diagram of the RFFE of FIG. 3 having a measurement system coupled to an antenna and the receiver to determine receiver insertion loss, according to embodiments of the present disclosure.

Instead, the disclosed embodiments combine a test signal with a wanted signal at an input of the duplexer 100 of the electronic device 10, and receive the test signal at an output of the duplexer 100, wherein the test signal may have less power than the wanted signal. FIG. 7 is a schematic diagram of the RFFE 50 having a measurement system 130 coupled to the antenna 55 and the receiver 53 to determine receiver insertion loss, according to embodiments of the present disclosure. The measurement system 130 may be implemented as hardware (e.g., circuitry), software (e.g., instructions stored in the memory 14 and/or the storage 16 and executable by the processor 12), or both (e.g. logic). As illustrated, the measurement system 130 is external to the duplexer 100, and, as such, may not be reliant on a type of the duplexer 100 (e.g., EBD, PBD, WBD, DBD, CBD, and so on) to determine performance of the duplexer 100. Moreover, if the measurement system 130 were to be internal to the duplexer 100, injecting a test signal within the duplexer 100 may result in the undesirable interference between the test signal and a wanted signal, resulting in poor user experience due to a corrupted wanted signal and/or inaccurate measurements from a corrupted test signal. That said, the measurement system 130 may be implemented as part of the transceiver 30, or external to the transceiver 30.

As illustrated, the measurement system 130 injects a test signal 132 into a wanted signal 134 (e.g., a downlink or receive signal received at the antenna 55) at combiner 136, which is disposed between the antenna 55 and the duplexer 100. The test or measurement signal 132 may include any signal (e.g., a pilot tone, a single tone signal, a multi-tone signal) having a power and frequency that the measurement system 130 is aware of (e.g., stores in the memory 14, the storage 16, and so on), such that the measurement system 130 may subsequently compare to the test signal 132 when output by the duplexer 100, to determine a change in the power and/or the frequency. Additionally, it should be understood that the combiner 136 may be any suitable circuitry that may combine the test signal 132 and the wanted signal 134 (e.g., a coupler, a hybrid). As such, the duplexer 100 receives the test signal 132 and the wanted signal 134 as a combined signal 138. To avoid interference with the wanted signal 134, the test signal 132 may have lower power. That is, compared to the wanted signal 134, the test signal 132 may be a very weak signal that may have similar or same frequency.

The measurement system 130 may receive the combined signal 138 via a splitter 140, which may be disposed between the duplexer 100 and the receiver 53. It should be understood that the splitter 140 may be any suitable circuitry that may split the combined signal 138 along multiple circuit paths (e.g., a divider, a hybrid). As illustrated, the measurement system 130 may receive the test signal 142A as output by the duplexer 100. As such, the test signal 132 input into the duplexer 100 may be referred to as an "input test signal 132," and the test signal 142A output by the duplexer 100 may be referred to as an "output test signal 142A." The receiver 53 may also receive the combined signal 138, which may include the wanted signal 134. In some embodiments, the measurement system 130 may extract the output test signal 142A from the combined signal 138, and/or the receiver 53 may extract the wanted signal 134 from the combined signal 138. In additional or alternative embodiments, the splitter 140 may extract or split the output test signal 142A from the wanted signal 134, and send the output test signal 142A (and not the wanted signal 134) to the measurement system 130, and send the wanted signal 134 (and not the output test signal 142A) to the receiver 53.

As the splitter 140 is disposed between the duplexer 100 and the receiver 53, the resulting output test signal 142A received by the measurement system 130 from the duplexer 100 via the splitter 140 may have a radio frequency. However, in some embodiments, an output test signal 142B may be received by the measurement system 130 from the receiver 53 (e.g., after downconversion). As such, the output test signal 142B may instead not have the radio frequency (e.g., it may have a baseband or intermediate frequency less than the radio frequency), and include a digital signal, such as in-phase and/or quadrature signals.

The measurement system 130 may then compare the output test signal 142A, 142B (collectively 142) to the input test signal 132, and determine a difference (e.g., a power difference, a phase difference) between the two, which may represent the receiver insertion loss. That is, the difference between the output test signal 142 and the input test signal 132 may represent loss in the test signal 142 (and thus the wanted signal 134) caused by the duplexer 100. In some implementations, the measurement system 130 may include a current sensor, voltage sensor, or power detector that receives the output test signal 142 to measure the current, voltage, or power of the output test signal 142 and determine the power or phase of the output test signal 142. The measurement system 130 may then compare the power or phase of the output test signal 142 with that of the input test signal 132 to determine the difference. The measurement system 130 may send an indication of the difference to the tuning algorithm 59, which may then adjust the current tuning state 58 of the duplexer to reduce or minimize the difference, thus reducing or minimizing the receiver insertion loss. That is, an ideal receiver insertion loss would be zero dB power loss.

While FIG. 7 illustrates the test signal 132 injected at the combiner 136 between the antenna 55 and the duplexer 100 and measured at the splitter 140 between the duplexer 100 and the receiver 53, in some embodiments, this may be reversed. That is, the combiner 136 may be the splitter 140, the splitter 140 may be the combiner 136, and the test signal 132 may be injected between the duplexer 100 and the receiver 53 and measured between the antenna 55 and the duplexer 100. Additionally, the processor 12 may configure the duplexer 100 to operate in a tuning state 58 by adjusting the tunable components 57 according to the tuning algorithm 59. The measurement system 130 may operate while the duplexer 100 is in the tuning state 58, and the tuning algorithm 59 may adjust the tuning state 58 and save the adjustments based on the difference between the output test signal 142 and the input test signal 132. In particular, the measurement system 130 may operate while the transmitter 52 is transmitting uplink signals of a given transmission frequency and the receiver 53 is receive downlink signals of a given receive frequency. However, in some embodiments, there may be no uplink or downlink signals present while the measurement system 130 operates and the tuning algorithm 59 adjusts the tuning state 58.

Figure 8:
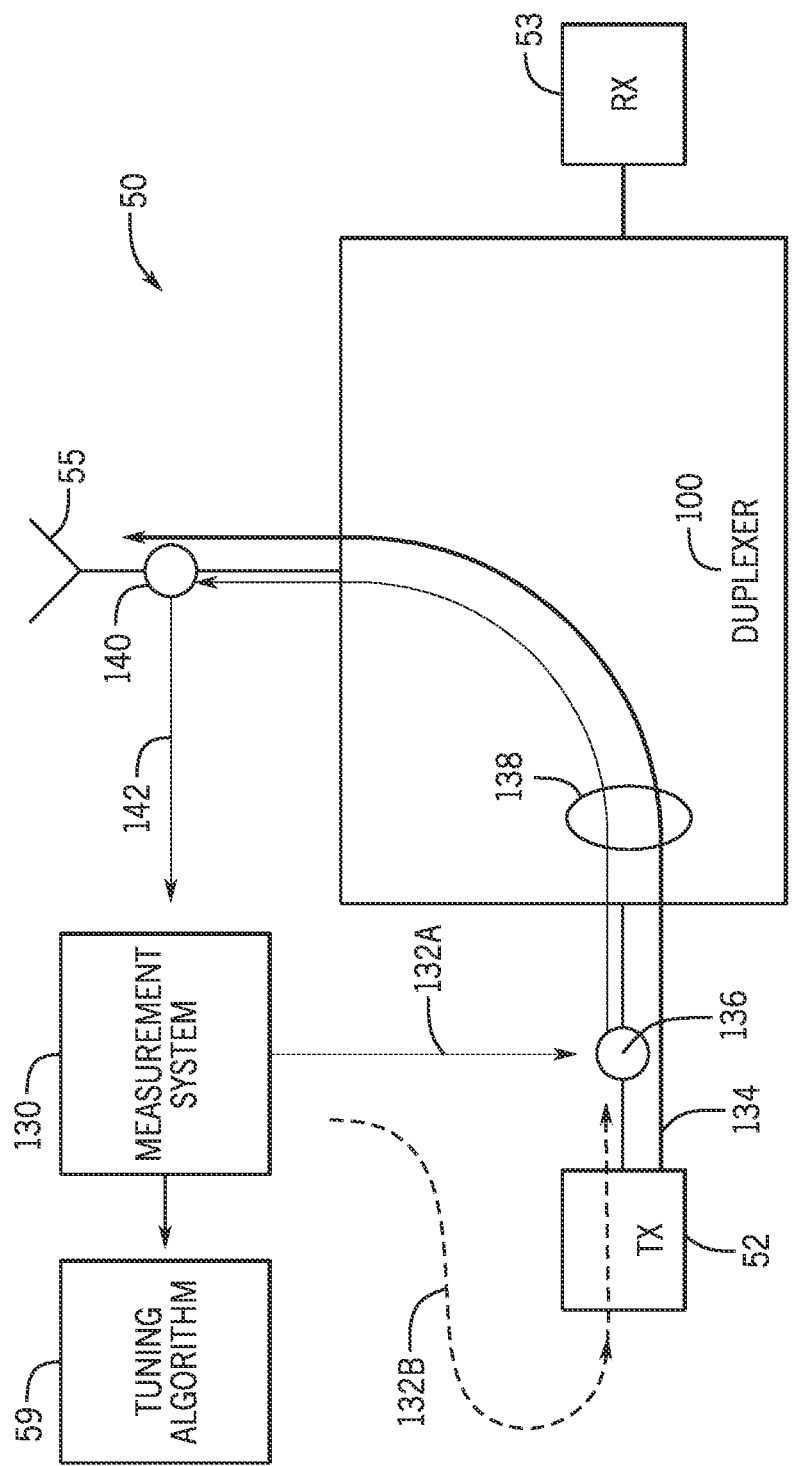
FIG. 8 is a schematic diagram of the RFFE of FIG. 3 having a measurement system coupled to the transmitter and the antenna to determine transmitter insertion loss, according to embodiments of the present disclosure.

In some embodiments, the measurement system 130 may also or alternatively measure transmitter insertion loss. FIG. 8 is a schematic diagram of the RFFE 50 having a measurement system 130 coupled to the transmitter 52 and the antenna 55 to determine transmitter insertion loss, according to embodiments of the present disclosure. As with the measurement system 130 shown in FIG. 7, the measurement system 130 is external to the duplexer 100, and, as such, may not be reliant on a type of the duplexer 100, and may avoid injecting the test signal 132 to interfere with a wanted signal.

As illustrated, the measurement system 130 injects an input test signal 132A into an a wanted signal 134 (e.g., an uplink or transmission signal sent by the transmitter 52) at combiner 136, which is disposed between the transmitter 52 and the duplexer 100. As such, the duplexer 100 receives the test signal 132A and the wanted signal 134 as a combined signal 138. The measurement system 130 may receive the combined signal 138 via a splitter 140, which may be disposed between the duplexer 100 and the antenna 55. The antenna 55 may also receive the combined signal 138, which may include the wanted signal 134. In some embodiments, the measurement system 130 may extract the output test signal 142 from the combined signal 138. In additional or alternative embodiments, the splitter 140 may extract or split the output test signal 142 from the wanted signal 134, and send the output test signal 142 (and not the wanted signal 134) to the measurement system 130, and send the wanted signal 134 (and not the output test signal 142) to the antenna 55.

As the combiner 136 is disposed between the transmitter 52 and the duplexer 100, the input test signal 132A sent by the measurement system 130 to the duplexer 100 via the combiner 136 may have a radio frequency. However, in some embodiments, the measurement system 130 may send an input test signal 132B to the transmitter 52 to be upconverted to have the radio frequency. As such, the input test signal 132B may instead not have the radio frequency (e.g., it may have a baseband or intermediate frequency less than the radio frequency), and include a digital signal, such as in-phase and/or quadrature signals.

The measurement system 130 may then compare the output test signal 142 to the input test signal 132A, 132B (collectively 132), and determine a difference (e.g., a power difference, a phase difference) between the two, which may represent a transmitter insertion loss. That is, the difference between the output test signal 142 and the input test signal 132 may represent loss in the test signal 142 (and thus the wanted signal 134) caused by the duplexer 100. In some implementations, the measurement system 130 may include a current sensor, voltage sensor, or power detector that receives the output test signal 142 to measure the current, voltage, or power of the output test signal 142 and determine the power or phase of the output test signal 142. The measurement system 130 may then compare the power or phase of the output test signal 142 with that of the input test signal 132 to determine the difference. The measurement system 130 may send an indication of the difference to the tuning algorithm 59, which may then adjust the current tuning state 58 of the duplexer to reduce or minimize the difference, thus reducing or minimizing the transmitter insertion loss. That is, an ideal transmitter insertion loss would be zero dB power loss.

While FIG. 8 illustrates the test signal 132 injected at the combiner 136 between the transmitter 52 and the duplexer 100 and measured at the splitter 140 between the duplexer 100 and the antenna 55, in some embodiments, this may be reversed. That is, the combiner 136 may be the splitter 140, the splitter 140 may be the combiner 136, and the test signal 132 may be injected between the antenna 55 and the duplexer 100 and measured between the duplexer 100 and the transmitter 52. Additionally, the processor 12 may configure the duplexer 100 to operate in a tuning state 58 by adjusting the tunable components 57 according to the tuning algorithm 59. The measurement system 130 may operate while the duplexer 100 is in the tuning state 58, and the tuning algorithm 59 may adjust the tuning state 58 and save the adjustments based on the difference between the output test signal 142 and the input test signal 132. In particular, the measurement system 130 may operate while the transmitter 52 is transmitting uplink signals of a given transmission frequency and the receiver 53 is receive downlink signals of a given receive frequency. However, in some embodiments, there may be no uplink or downlink signals present while the measurement system 130 operates and the tuning algorithm 59 adjusts the tuning state 58.

Figure 9:
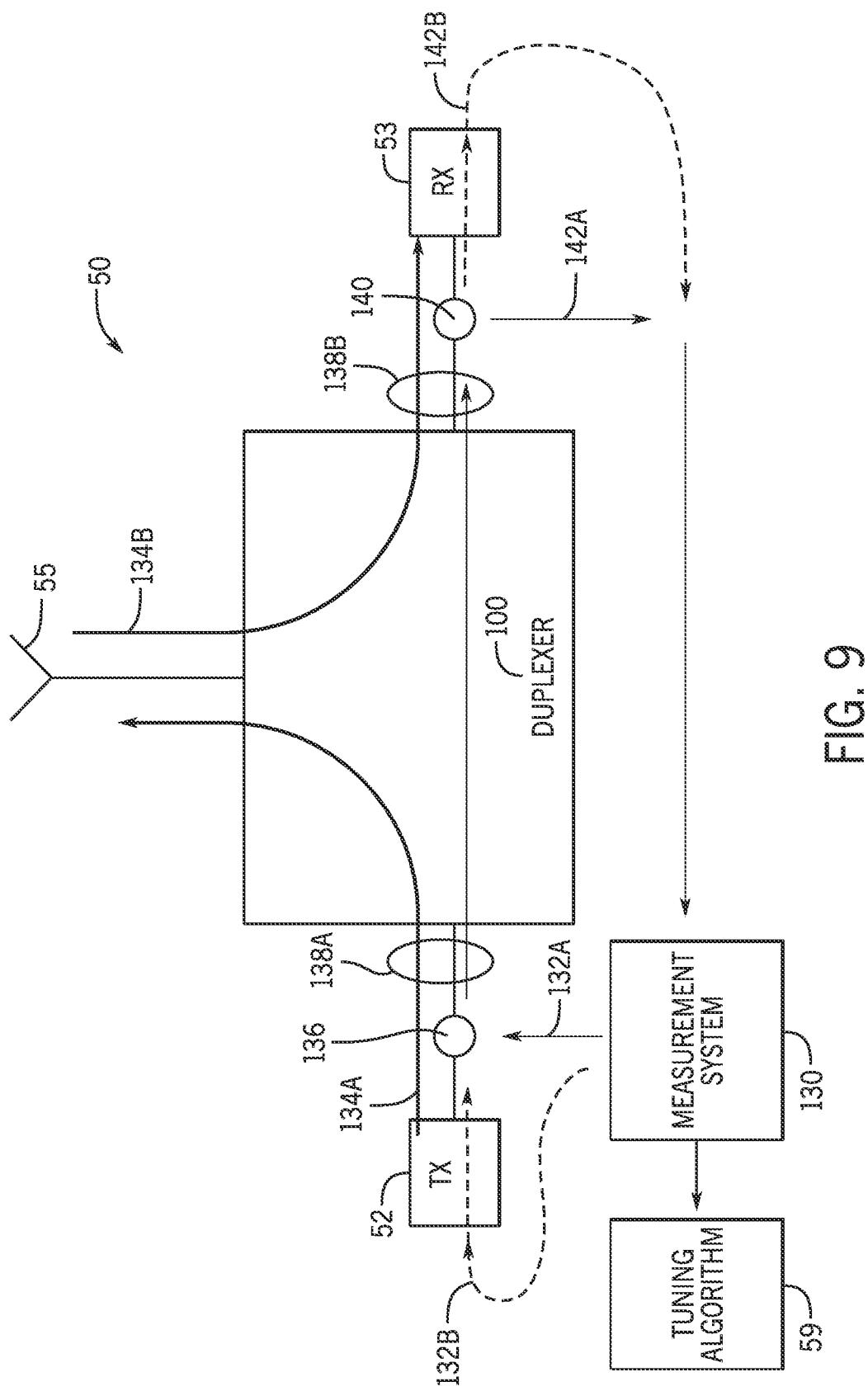
FIG. 9 is a schematic diagram of the RFFE of FIG. 3 having a measurement system coupled to the receiver and the transmitter to determine isolation between the receiver and the transmitter, according to embodiments of the present disclosure.

The measurement system 130 may also or alternatively measure isolation between the receiver 53 and the transmitter 52. FIG. 9 is a schematic diagram of the RFFE 50 having a measurement system 130 coupled to the receiver 53 and the transmitter 52 to determine isolation between the receiver 53 and the transmitter 52, according to embodiments of the present disclosure. As with the measurement system 130 shown in FIG. 7, the measurement system 130 is external to the duplexer 100, and, as such, may not be reliant on a type of the duplexer 100, and may avoid injecting the test signal 132 to interfere with a wanted signal.

As illustrated, the measurement system 130 injects an input test signal 132A into the wanted signal 134 (e.g., a transmission or uplink signal sent by the transmitter 52) at combiner 136, which is disposed between the transmitter 52 and the duplexer 100. As such, the duplexer 100 receives the test signal 132A and a wanted uplink signal 134A as a combined uplink signal 138A. The measurement system 130 may receive a combined downlink signal 138B via a splitter 140, which may be disposed between the duplexer 100 and the antenna 55. The receiver 53 may also receive the combined downlink signal 138B, which may include an output test signal 142A and a wanted downlink signal 134B. In some embodiments, the measurement system 130 may extract the output test signal 142A from the combined downlink signal 138B. In additional or alternative embodiments, the splitter 140 may extract or split the output test signal 142A from the wanted downlink signal 134B, and send the output test signal 142A (and not the wanted downlink signal 134B) to the measurement system 130, and send the wanted downlink signal 134B (and not the output test signal 142A) to the receiver 53.

As the combiner 136 is disposed between the transmitter 52 and the duplexer 100, and the splitter 140 is disposed between the duplexer 100 and the receiver 53, the input test signal 132A sent by the measurement system 130 to the duplexer 100 via the combiner 136 may have a radio frequency. However, in some embodiments, the measurement system 130 may send an input test signal 132B to the transmitter 52 to be upconverted to have the radio frequency. As such, the input test signal 132B may instead not have the radio frequency (e.g., it may have a baseband or intermediate frequency less than the radio frequency), and include a digital signal, such as in-phase and/or quadrature signals. Similarly, as the splitter 140 is disposed between the duplexer 100 and the receiver 53, the resulting output test signal 142A received by the measurement system 130 from the duplexer 100 via the splitter 140 may have a radio frequency. However, in some embodiments, an output test signal 142B may be received by the measurement system 130 from the receiver 53 (e.g., after downconversion). As such, the output test signal 142B may instead not have the radio frequency (e.g., it may have a baseband or intermediate frequency less than the radio frequency), and include a digital signal, such as in-phase and/or quadrature signals.

The measurement system 130 may then compare the output test signal 142A, 142B (collectively 142) to the input test signal 132A, 132B (collectively 132), and determine a difference (e.g., a power difference, a phase difference) between the two, which may represent isolation between the receiver 53 and the transmitter 52. That is, the difference between the output test signal 142 and the input test signal 132 may represent isolation in the test signal 142 (and thus the wanted signal 134) caused by the duplexer 100. In particular, the isolation may be defined by a ratio between the power of the output test signal 142 divided by the power of the input test signal 132. As such, an ideal isolation would be zero, where the output test signal 142 may have zero power, indicating that the receiver 53 receives zero power of the test signal 132 transmitted by the measurement system 130. In some implementations, the measurement system 130 may include a current sensor, voltage sensor, or power detector that receives the output test signal 142 to measure the current, voltage, or power of the output test signal 142 and determine the power or phase of the output test signal 142. The measurement system 130 may then compare the power or phase of the output test signal 142 with that of the input test signal 132 to determine the ratio. The measurement system 130 may send an indication of the ratio to the tuning algorithm 59, which may then adjust the current tuning state 58 of the duplexer to reduce or minimize the ratio, thus reducing or minimizing the isolation.

While FIG. 9 illustrates the test signal 132 injected at the combiner 136 between the transmitter 52 and the duplexer 100 and measured at the splitter 140 between the duplexer 100 and the receiver 53, in some embodiments, this may be reversed. That is, the combiner 136 may be the splitter 140, the splitter 140 may be the combiner 136, and the test signal 132 may be injected between the receiver 53 and the duplexer 100 and measured between the duplexer 100 and the transmitter 52. Additionally, the processor 12 may configure the duplexer 100 to operate in a tuning state 58 by adjusting the tunable components 57 according to the tuning algorithm 59. The measurement system 130 may operate while the duplexer 100 is in the tuning state 58, and the tuning algorithm 59 may adjust the tuning state 58 and save the adjustments based on the difference between the output test signal 142 and the input test signal 132. In particular, the measurement system 130 may operate while the transmitter 52 is transmitting uplink signals of a given transmission frequency and the receiver 53 is receive downlink signals of a given receive frequency. However, in some embodiments, there may be no uplink or downlink signals present while the measurement system 130 operates and the tuning algorithm 59 adjusts the tuning state 58.

Figure 10:
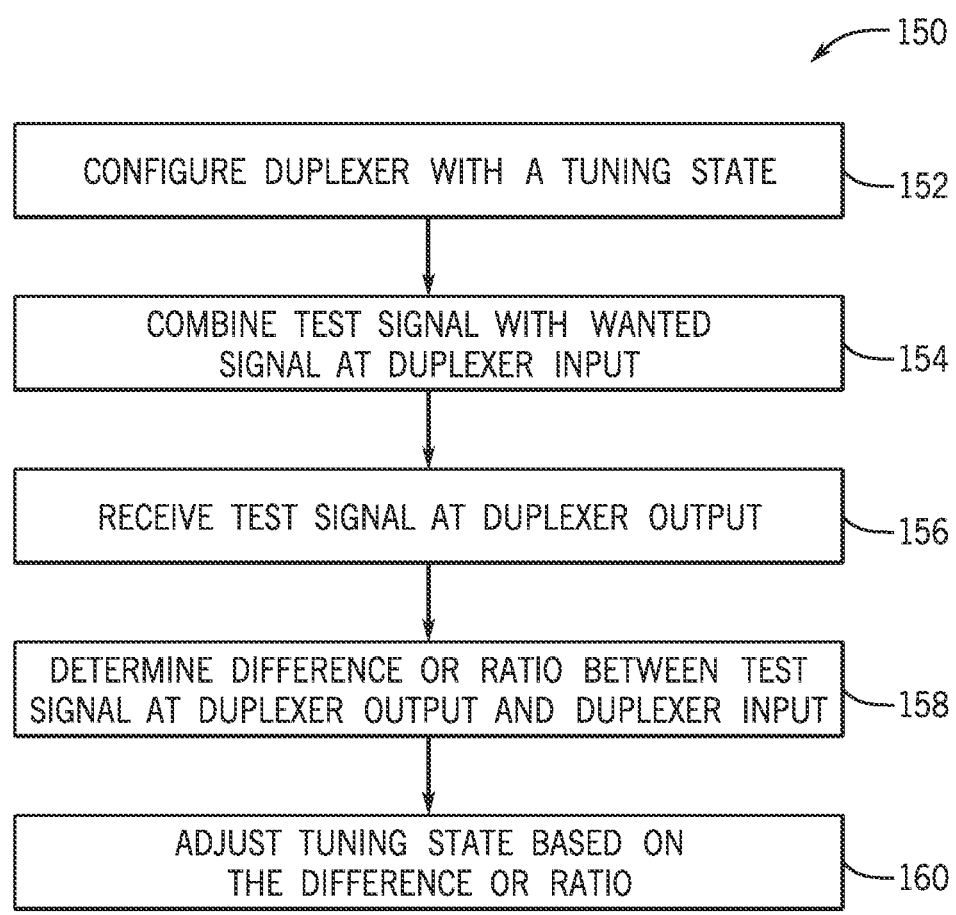
FIG. 10 is a flowchart of a method for adjusting a tuning state of the duplexer of FIG. 6 based on a difference of a test signal at a duplexer input and a duplexer output, according to embodiments of the present disclosure.

It should be understood that any or all three of the embodiments of the measurement system 130 shown in FIGS. 7-9 may be implemented in the electronic device 10. That is, the electronic device 10 may implement any or all of the combiners 136 and/or the splitters 140 shown in the FIGS. 7-9, which may be coupled to the measurement system 130. FIG. 10 is a flowchart of a method 150 for adjusting a tuning state 58 of the duplexer 100 based on a difference or ratio of the test signal 132, 142 at a duplexer input and a duplexer output, according to embodiments of the present disclosure. The duplexer input may refer to where the input test signal 132 is injected (e.g., at the combiner 136), and the duplexer output may refer to where the output test signal 142 is measured (e.g., at the splitter 140). Any suitable device (e.g., a controller) that may control components of the electronic device 10, such as the processor 12, may perform the method 150. In some embodiments, the method 150 may be implemented by executing instructions stored in a tangible, non-transitory, computer-readable medium, such as the memory 14 or storage 16, using the processor 12. For example, the method 150 may be performed at least in part by one or more software components, such as an operating system of the electronic device 10, one or more software applications of the electronic device 10, and the like. While the method 150 is described using steps in a specific sequence, it should be understood that the present disclosure contemplates that the described steps may be performed in different sequences than the sequence illustrated, and certain described steps may be skipped or not performed altogether.

In process block 152, the processor 12 configures the duplexer 100 with a tuning state 58. In particular, the processor 12 may receive an indication of a transmission frequency for which to transmit uplink signals using the transmitter 52 and a receive frequency for which to receive downlink signals using the receiver 53. In some embodiments, the processor 12 may receive the indication from a base station, a wireless communication network, an access point, a communication node, a communication hub, and so on. The tuning algorithm 59 may provide the tuning state 58 based on the transmission and receive frequencies, and the processor 12 may adjust the tunable components 57 (e.g., one or more impedance tuners, one or more phase shifters, and so on) of the duplexer 100 based on the tuning state 58.

In process block 154, the processor 12 combines the test signal 132 with the wanted signal 134 at the duplexer input. In particular, the processor 12 may cause the measurement system 130 to send the input test signal 132 to the combiner 136 between the antenna 55 and the duplexer 100 to be combined with the wanted signal 134 (e.g., a wanted downlink signal) as shown in FIG. 7, send the input test signal 132A to the combiner 136 between the transmitter 52 and the duplexer 100 to be combined with the wanted signal 134 (e.g., a wanted uplink signal) as shown in FIG. 8, and/or send the input test signal 132 to the combiner 136 between the transmitter 52 and the duplexer 100 to be combined with the wanted uplink signal 134A as shown in FIG. 9.

In process block 156, the processor 12 receives the test signal 142 at the duplexer output. In particular, the processor 12 may cause the measurement system 130 to detect or measure the output test signal 142 at the splitter 140 between the duplexer 100 and the receiver 53 as part of the combined signal 138 (e.g., a combined downlink signal) as shown in FIG. 7, detect or measure the output test signal 142 at the splitter 140 between the duplexer 100 and the antenna 55 as part of the combined signal 138 (e.g., a combined uplink signal) as shown in FIG. 8, and/or detect or measure the output test signal 142 at the splitter 140 between the duplexer 100 and the receiver 53 as part of the combined downlink signal 138B as shown in FIG. 9.

In process block 158, the processor 12 determines a difference or ratio between the test signal 142 at the duplexer output and the test signal 132 at the duplexer input. In particular, to determine the receiver or transmitter insertion loss, the processor 12 may determine a power loss between the test signal 142 at the duplexer output and the test signal 132 at the duplexer input. To determine the isolation between the receiver 53 and the transmitter 52, the processor 12 may determine a ratio between power of the test signal 142 at the duplexer output and power of the test signal 132 at the duplexer input.

In process block 160, the processor 12 adjusts (e.g., using the tuning algorithm 59) the tuning state 58 based on the difference or ratio. In particular, the processor 12 may adjust the tuning state 58 of the tunable components 57 of the duplexer 100 to reduce or minimize the receiver insertion loss, the transmitter insertion loss, and/or the isolation ratio (thus increasing or maximizing isolation) between the receiver 53 and the transmitter 52. In this manner, the method 150 may adjust the tuning state 58 of the duplexer 100 based on a difference or ratio of the test signal 132, 142 at the duplexer input and the duplexer output to improve insertion loss and/or isolation performance of the duplexer 100.

Figure 11:
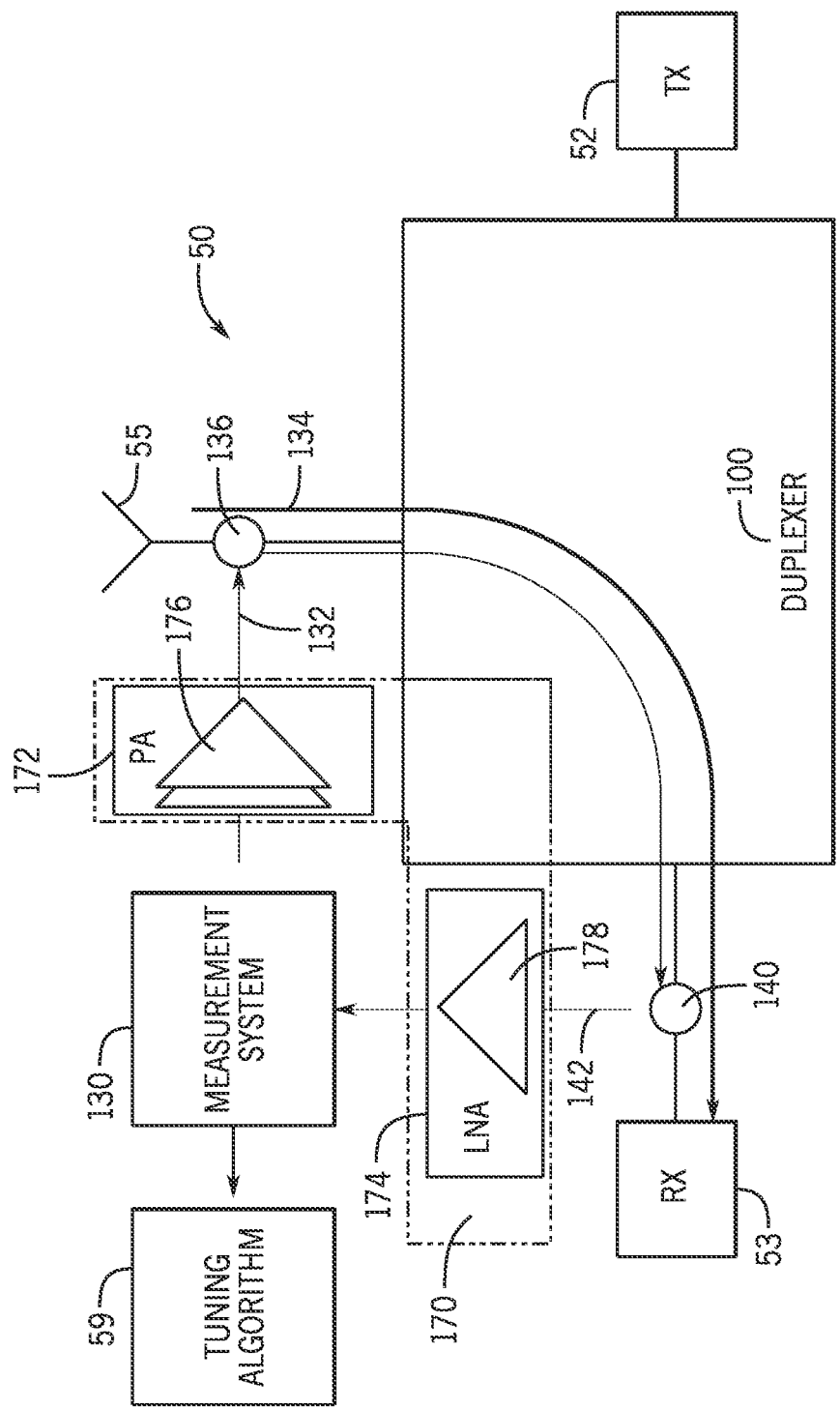
FIG. 11 is a schematic diagram of the RFFE of FIG. 3 having a measurement system coupled to an additional transceiver that may adjust the power or frequency of a test signal, according to embodiments of the present disclosure.

In some embodiments, the measurement system 130 may adjust power or frequency of the input test signal 132 and/or the output test signal 142. FIG. 11 is a schematic diagram of the RFFE 50 having a measurement system 130 coupled to an additional transceiver 170 (e.g., a measurement transceiver) that may adjust the power or frequency of the input test signal 132 and/or the output test signal 142, according to embodiments of the present disclosure. While the measurement transceiver 170 is illustrated as coupled to the measurement system 130, in some embodiments, the measurement system 130 may include the measurement transceiver 170. As illustrated, the measurement transceiver 170 may include a transmitter 172 (e.g., a measurement transmitter) and a receiver 174 (e.g., a measurement receiver). The measurement transmitter 172 may include one or more amplifiers 176 (e.g., power amplifiers), and the measurement receiver 174 may include one or more amplifiers 178 (e.g., low noise amplifiers). The one or more amplifiers 176 of the measurement transmitter 172 may amplify the input test signal 132 to increase power of the input test signal 132. Additionally or alternatively, the measurement transmitter 172 may include one or more phase shifters, mixers, or frequency conversion circuitry to adjust a frequency of the input test signal 132 (e.g., to match a wanted signal 134, or differentiate from the wanted signal 134). Similarly, one or more amplifiers 178 of the measurement receiver 174 may amplify the output test signal 142 to increase power of the output test signal 142. Moreover, the measurement receiver 174 may include one or more phase shifters, mixers, or frequency conversion circuitry to adjust a frequency of the output test signal 142 (e.g., to match the wanted signal 134, or differentiate from the wanted signal 134).

While the measurement transceiver 170 is illustrated as having both the measurement transmitter 172 having the one or more amplifiers 176 and the measurement receiver 174 having the one or more amplifiers 178, in additional or alternative embodiments, the measurement transceiver 170 may have only the measurement transmitter 172, or only the measurement receiver 174. Moreover, FIG. 11 illustrates the measurement transceiver 170 being implemented to facilitate measuring receiver insertion loss. In additional or alternative embodiments, the measurement transceiver 170 may facilitate measuring transmitter insertion loss (e.g., such that the measurement transmitter 172 is coupled to the combiner 136 between the transmitter 52 and the duplexer 100 and the measurement receiver 174 is coupled to the splitter 140 between the duplexer 100 and the antenna 55, as shown in FIG. 8) and/or isolation (e.g., such that the measurement transmitter 172 is coupled to the combiner 136 between the transmitter 52 and the duplexer 100 and the measurement receiver 174 is coupled to the splitter 140 between the duplexer 100 and the receiver 53, as shown in FIG. 9).

Figure 12:
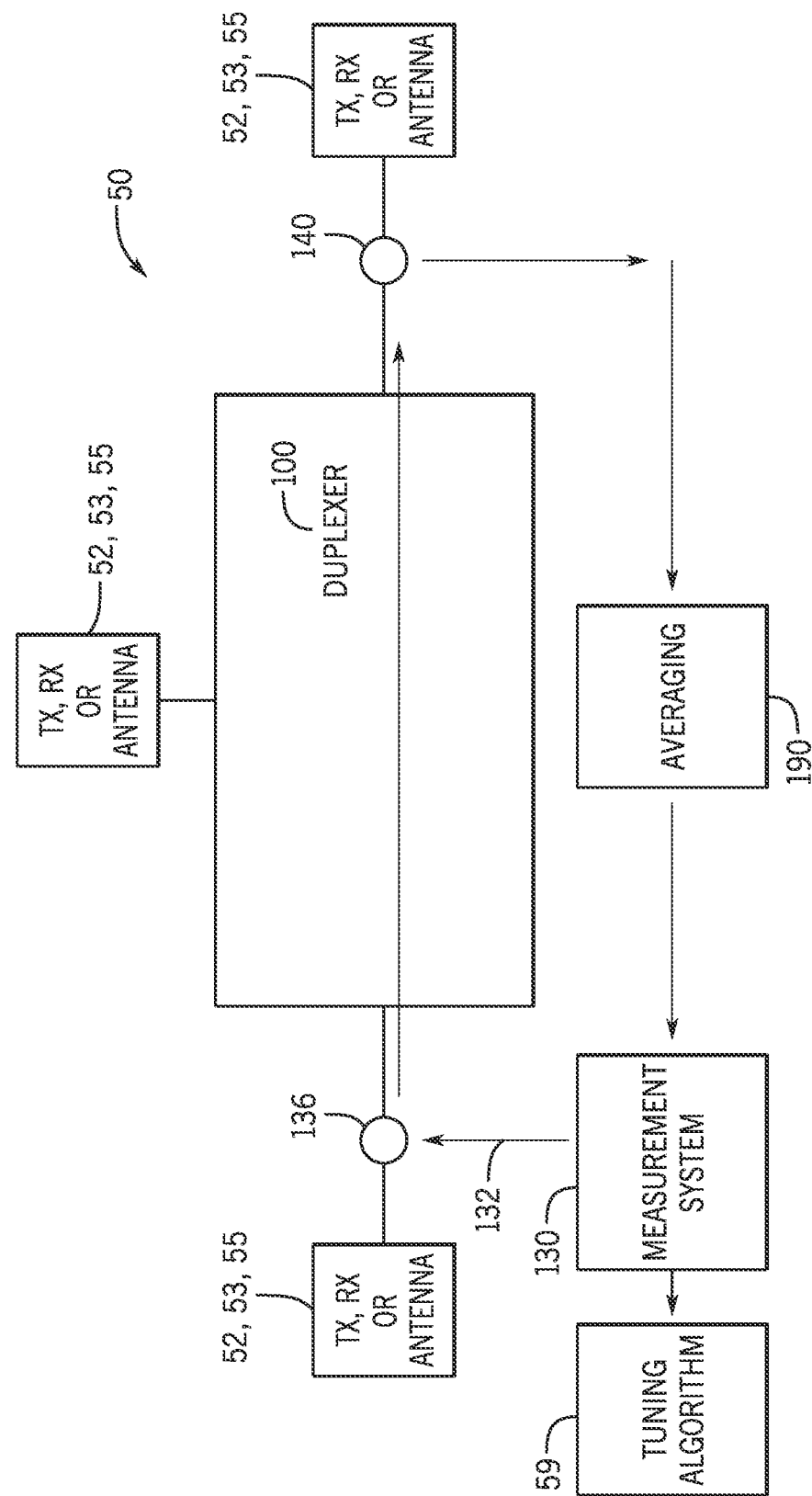
FIG. 12 is a schematic diagram of the RFFE of FIG. 3 having averaging logic that increases power of a test signal by averaging multiple measurements of a signal combining the test signal and a wanted signal to facilitate detection and extraction of the test signal, according to embodiments of the present disclosure.

Because the test signal 132 (e.g., a pilot tone) may have weak power (e.g., less than a wanted signal 134 with which it is combined), detecting and extracting the test signal (e.g., the output test signal 142) from a combined signal 138 may be difficult. In some embodiments, the RFFE 50 and/or the measurement system 130 may include averaging logic (e.g., hardware, software, or both) that increases power of the test signal 142 by averaging multiple measurements of the combined signal 138, such that the test signal 142 is more easily detectable and extractible by the measurement system 130. FIG. 12 is a schematic diagram of the RFFE 50 having averaging logic 190 that increases power of the test signal 142 by averaging multiple measurements of the combined signal 138 to facilitate detection and extraction of the test signal 142, according to embodiments of the present disclosure. The averaging logic 190 may include any suitable components, such as capacitive elements (e.g., one or more capacitors) that may enable increasing the power of the test signal 142 for the time period. In some embodiments, the averaging logic 190 may include more complex components, such as switching circuitry (e.g., one or more switches) to facilitate increasing the power of the test signal 142 by averaging multiple measurements of the combined signal 138. As illustrated, the averaging logic 190 may average the combined signal 138 to enable a more detectable and extractible output test signal 142. As such, the averaging logic 190 may be coupled between the splitter 140 (e.g., at an output of the duplexer 100) and the measurement system 130. Additionally, the blocks 52, 53, 55 may each represent one of the receiver 53, the transmitter 52, and the antenna 55, illustrating that the averaging logic 190 may be coupled between any of these components 52, 53, 55 and the measurement system 130. The averaging logic 190 may perform any suitable signal averaging technique by obtaining or receiving multiple measurements of the combined signal 138, in the time domain, and averaging the multiple measurements to increase the strength of the test signal 142 relative to noise that is obscuring it, in this case the wanted signal 134. By averaging the multiple measurements of the combined signal 138, the averaging logic 190 may increase a signal-to-noise ratio of the test signal 142 relative to the wanted signal 134 (e.g., in proportion to a square root of the number of measurements).

Figure 13:
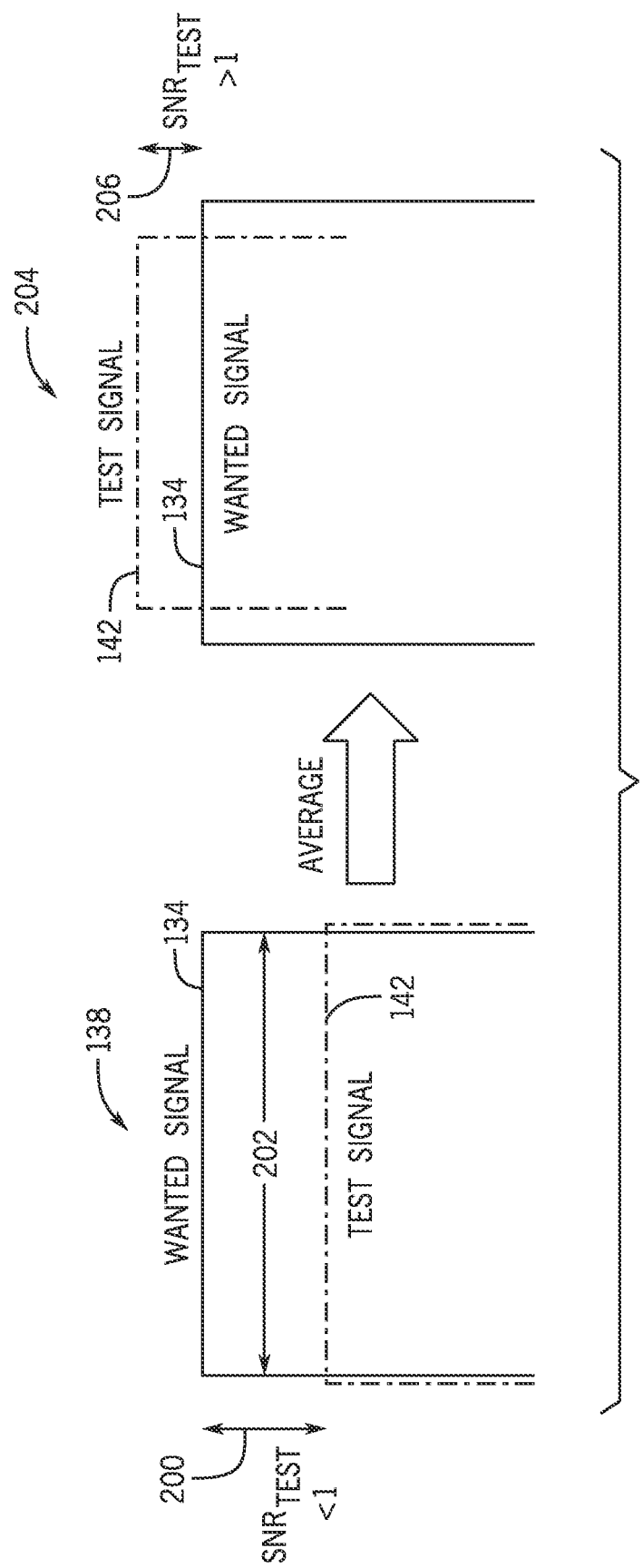
FIG. 13 is a set of frequency diagrams indicating power of a combined signal having a test signal and a wanted signal, before and after averaging, according to embodiments of the present disclosure.

FIG. 13 is a set of frequency diagrams indicating power of a combined signal 138 having a test signal 142 and a wanted signal 134, before and after averaging, as performed by the averaging logic 190, according to embodiments of the present disclosure. Each frequency diagram represents frequency horizontally and power or voltage vertically. Before averaging, the test signal 142 may have less power 200 than the wanted signal 134. In particular, for a bandwidth 202 of the combined signal 138 (e.g., 5 megahertz (MHz) or less, 10 MHz or less, 20 MHz or less, 60 MHz or less, 100 MHz or less, 200 MHz or less, and so on), the test signal 142 may have a signal-to-noise ratio of less than 1, where the wanted signal 134 is noise relative to the test signal 142. However, after averaging multiple measurements of the combined signal 138, an averaged combined signal 204 the power of the test signal 142 may increase 206 over that of the wanted signal 134. As such, the test signal 142 in the averaged combined signal 204 may have a signal-to-noise ratio of greater than 1 relative to the wanted signal 134. This may make the test signal 142 more detectable and easier to extract for the measurement system 130.

Figure 14:
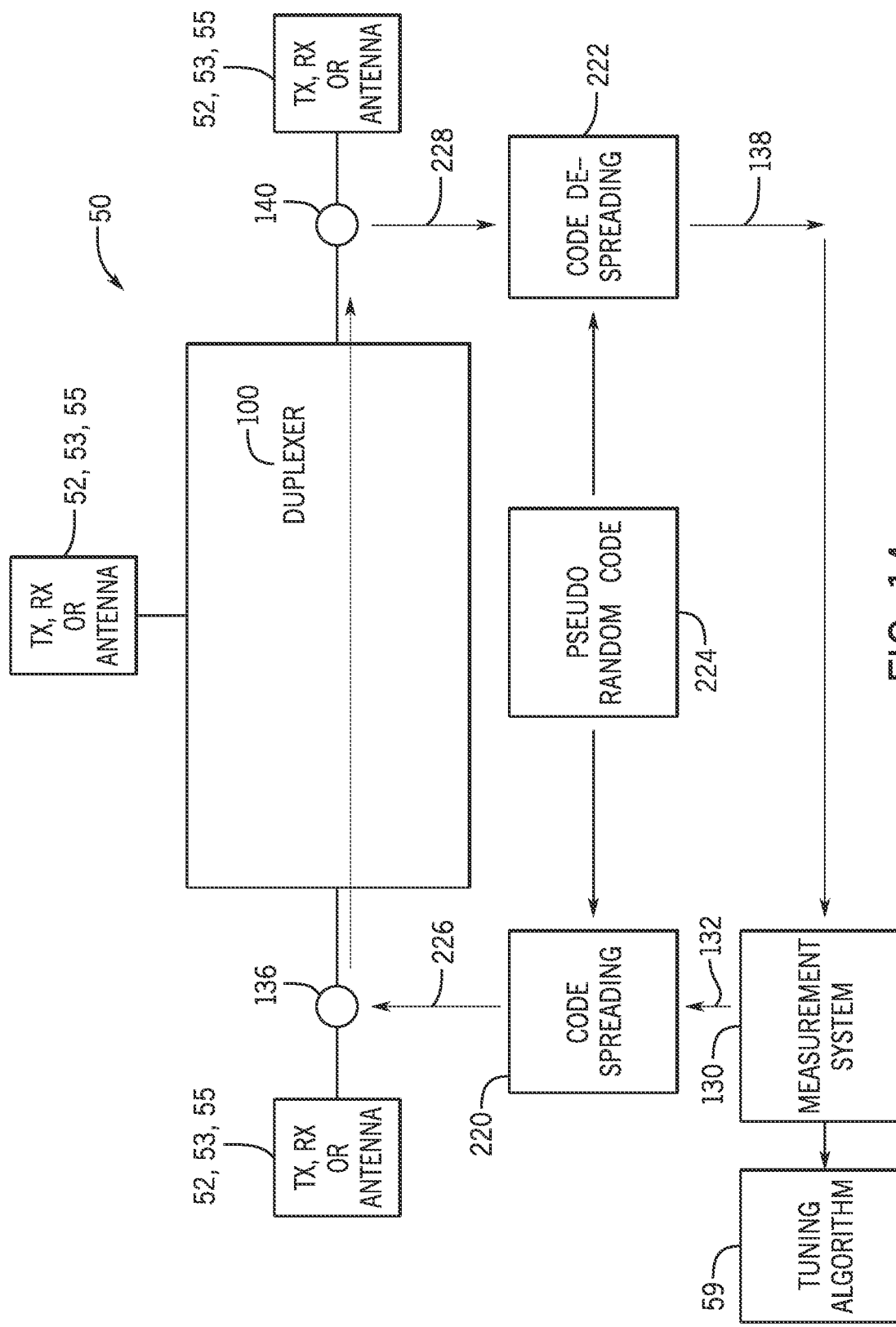
FIG. 14 is schematic diagram of the RFFE of FIG. 3 having code spreading and de-spreading logic that applies a spreading code to a test signal to enable low power associated with the test signal, according to embodiments of the present disclosure.

As noted above, the test signal 132 may have a lower power than the wanted signal 134. In some cases, the power associated with the test signal 132 may approach or exceed a noise floor of the measurement system 130 of the electronic device 10. To enable detection and extraction of the test signal 132 that is associated with this low power, and enable the measurement system 130 to accurately measure the output test signal 142, the measurement system 130 may use a code spreading technique, or other similar technique. This may also be used to prevent the test signal 132 from influencing (e.g., drowning out or interfering with) the wanted signal 134. FIG. 14 is schematic diagram of the RFFE 50 having code spreading logic 220 and code de-spreading logic 222 that applies a spreading code 224 to the test signal 132 to enable low power associated with the test signal 132, according to embodiments of the present disclosure. The code spreading logic 220 and the code de-spreading logic 222 may be implemented in hardware, software, or both. The spreading code 224 applied or encoded by the code spreading logic 220, and removed or decoded by the code de-spreading logic 222, may include a pseudo-random code, such as Gold code, Walsh code, or any other code-division multiple access (CDMA) code or pseudo-random noise sequence.

Figure 15:
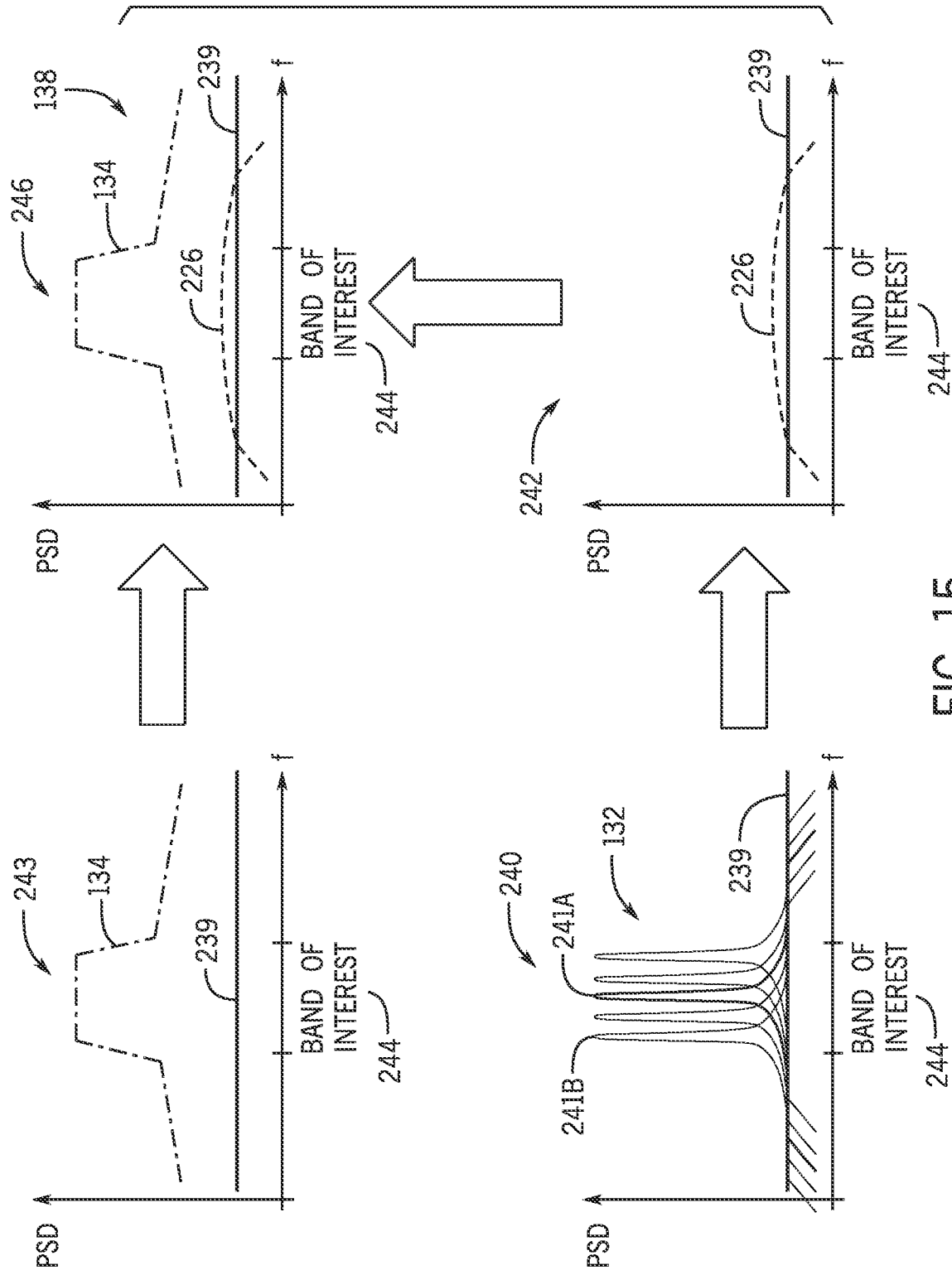
FIG. 15 is a set of frequency diagrams illustrating application of a spreading code, according to embodiments of the present disclosure.

In particular, the code spreading logic 220 may be coupled to the combiner 136 (e.g., at an input of the duplexer 100) and receive the test signal 132. The code spreading logic 220 may apply the spreading code 224 to the test signal 132 to generate a spreaded test signal 226. For example, the test signal 132 may include one or more tones having narrower bandwidth and higher power. FIG. 15 is a set of frequency diagrams illustrating application of the spreading code 224, according to embodiments of the present disclosure. Each frequency diagram includes a horizontal axis representing frequency and a vertical axis representing power (e.g., power spectral density (PSD)), as well as a noise floor 239 of the measurement system 130 (e.g., a sum of noise sources received or detected by the measurement system 130). The bottom left frequency diagram 240 illustrates the test signal 132, which may have a single tone 241A, or include multiple tones (including tones 241A and 241B). As noted, the test signal 132 (e.g., the tone 241A or tones (including 241A, 241B, collectively 241) has a bandwidth within a frequency band of interest 244, which may include a transmission frequency range or a receive frequency range, and has a higher power.

Applying the spreading code 224 to the test signal 132 may resulting in generating the spreaded test signal 226 having a wider bandwidth and lower power (e.g., than that of the one or more tones 241 prior to spreading). A bottom right frequency diagram 242 of FIG. 15 illustrates the spreaded test signal 226 after the code spreading logic 220 has applied the spreading code 224 to the test signal 132. As illustrated, the spreaded test signal 226 has a wider bandwidth and lower power than the input test signal 132 of the frequency diagram 240. Indeed, the power of the spreaded test signal 226 is near, and, in certain portions, may even exceed the noise floor 239.

The top left frequency diagram 243 of FIG. 15 illustrates the wanted signal 134 (e.g., uplink or downlink), which is shown having a higher power at the frequency band of interest 244. The measurement system 130 may combine the spreaded test signal 226 and the wanted signal 134 at the combiner 136 to generate the combined signal 138. The top right frequency diagram 246 of FIG. 15 illustrates the combined signal 138 having the wanted signal 134 and the spreaded test signal 226. As illustrated, the spreaded test signal 226 has much lower power than the wanted signal 134.

Figure 16:
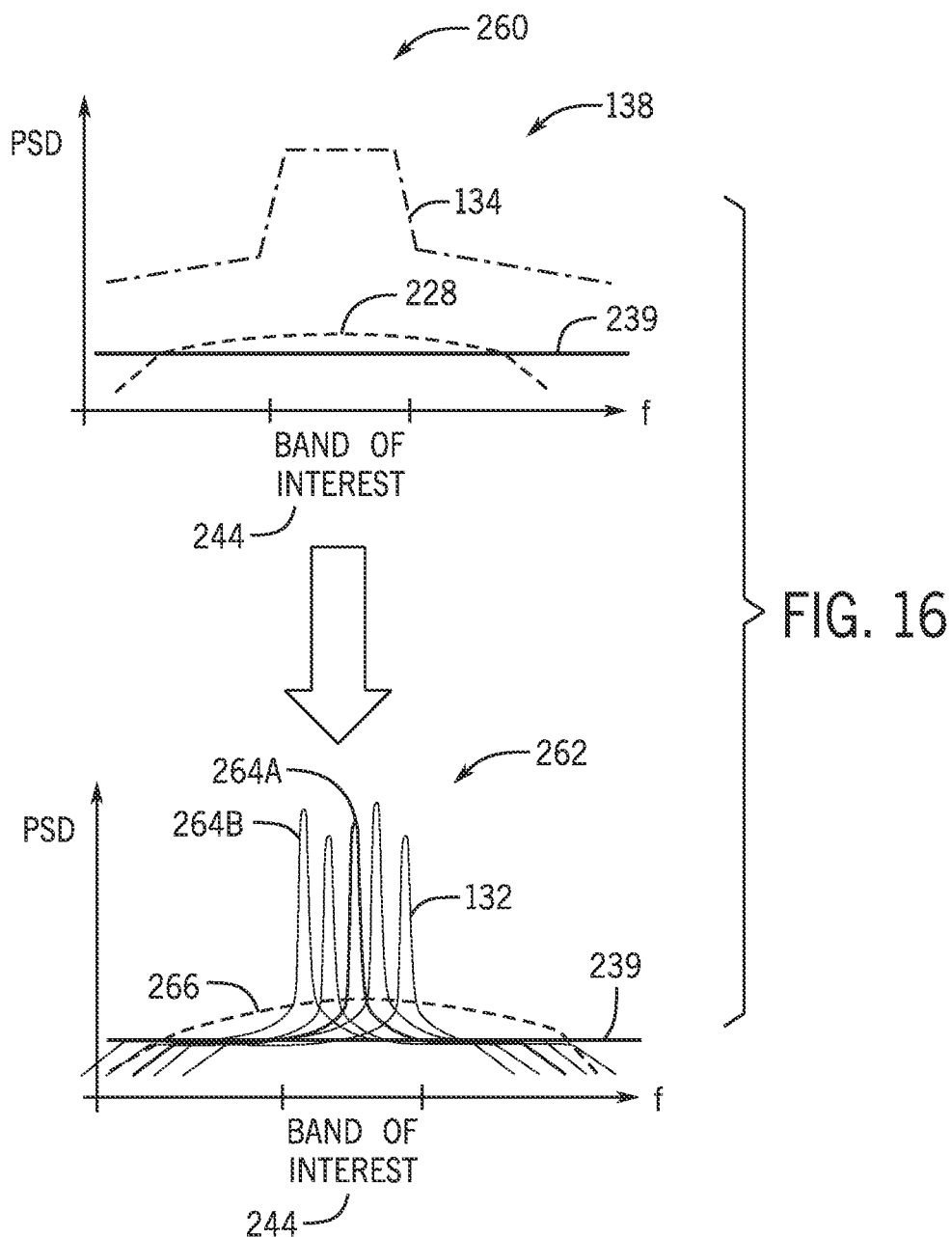
FIG. 16 is a set of frequency diagrams illustrating removal of the spreading code, according to embodiments of the present disclosure.

Referring back to FIG. 14, the combined signal 138 may then traverse the duplexer 100 and, as output by the duplexer 100, reach the splitter 140. The splitter 140 may send the combined signal 138 to the receiver 53 or the antenna 55, as well as the code de-spreading logic 222. From the standpoint of the receiver 53 or the antenna 55, because the power of the spreaded test signal 226 in the combined signal 138 is much lower than that of the wanted signal 134, the spreaded test signal 226 may have little to no effect on data in the wanted signal 134 when received at the receiver 53 or transmitted via the antenna 55, and thus may not interfere with the wanted signal 134. FIG. 16 is a set of frequency diagrams illustrating removal of the spreading code 224, according to embodiments of the present disclosure. Each frequency diagram includes a horizontal axis representing frequency and a vertical axis representing power (e.g., PSD), as well as the noise floor 239 of the measurement system 130. The top frequency diagram 260 illustrates the combined signal 138 as output by the duplexer 100 at the splitter 140, which may be received by the receiver 53 or the antenna 55, as well as the code de-spreading logic 222. As illustrated, the power of the spreaded test signal 228 of the combined signal 138 output by the duplexer 100 is much lower than that of the wanted signal 134, and, as such, may not interfere with the wanted signal 134. As the spreaded test signal 226 of FIG. 15 is input to the duplexer 100 (e.g., at the combiner 136), and the spreaded test signal 228 is output by the duplexer 100 (e.g., at the splitter 140), the spreaded test signal 226 may be referred to as an input spreaded test signal, and the spreaded test signal 228 may be referred to as an output spreaded test signal.

The bottom frequency diagram 262 illustrates the combined signal 138 after de-spreading. In particular, the code de-spreading logic 222 may receive the combined signal 138 output by the duplexer 100, and decode the output test signal 142 by removing the spreading code 224. Accordingly, the output spreaded test signal 228 may be de-spreaded, generating the output test signal 142. As with the input test signal 132 shown in the bottom left frequency diagram 240 of FIG. 15, the output test signal 142 may include one or more tones 264A, 264B, depending on whether the test signal is single- or multi-tone. Additionally, de-spreading the wanted signal 134 generates a de-spreaded wanted signal 266. Advantageously, like the spreaded test signal 226 of FIG. 15, the de-spreaded wanted signal 266 has a wider bandwidth and lower power than the wanted signal 134 before de-spreading. Moreover, it has a much lower power than the output test signal 142, which may enable the measurement system 130 to easily detect and extract the output test signal 142. The measurement system 130 may then compare the output test signal 142 to the input test signal 132 to determine a difference or ratio, and determine insertion loss or isolation performance based on the difference or ratio, as discussed above. By leveraging the power difference in signals due to spreading and de-spreading, desired signals (e.g., the output test signal 142) may be easily detected and extracted, and, in some cases, foregoing a need of using a filter or other circuitry or devices used to detect or extract the desired signals. Indeed, a simple splitter 140 may be sufficient to detect or extract the desired signals when used in conjunction with the code spreading logic 220 and the code de-spreading logic 222.

In some embodiments, the test signal 132 may include an orthogonal frequency-division modulation (OFDM) signal.

Figure 17:
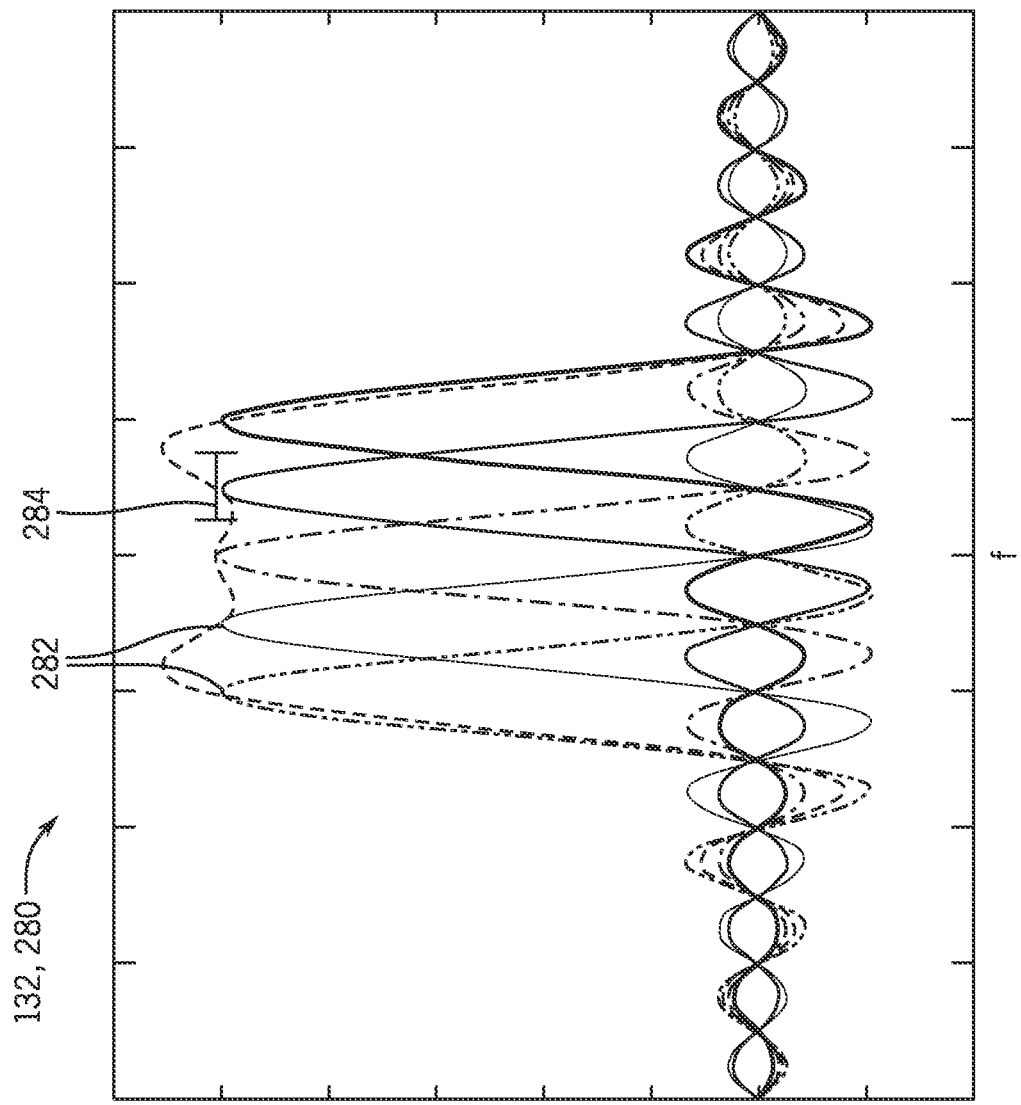
FIG. 17 is a frequency diagram illustrating a test signal implemented as an OFDM signal, according to embodiments of the present disclosure.

FIG. 17 is a frequency diagram illustrating the test signal 132 implemented as an OFDM signal 280, according to embodiments of the present disclosure. The frequency diagram includes a horizontal axis representing frequency and a vertical axis representing power. Advantageously, the OFDM signal 280 may include multiple tones or subcarriers 282, each having a frequency resolution 284. As such, the OFDM signal 280 may enable a test signal 132 having multiple tones 282 that are independent (e.g., where the tones 282 may not interfere with one another due to their respective frequency resolutions 284). That is, the OFDM signal 280 may enable combining multiple tones 282, without interference between the tones 282. Moreover, because the OFDM signal 280 is similar to certain cellular signals (e.g., fourth generation (4G) or fifth generation (5G) cellular signals), the electronic device 10 may implement the OFDM signal 280 as the test signal 132 without additional or with minimal additional hardware or logic.

In embodiment, an electronic device comprises a memory storing a tuning state; an antenna configured to receive a downlink signal; a receiver; a transmitter configured to transmit an uplink signal; a duplexer comprising a tunable component configurable based on the tuning state; a combiner coupled to the transmitter and the duplexer; a splitter coupled to the duplexer and the receiver; and a processor coupled to the combiner and the splitter. The processor is configured to combine a first signal with the uplink signal at the combiner to generate a first combined signal, receive a second combined signal comprising a second signal and the downlink signal at the splitter, and adjust the tuning state based on the first signal and the second signal.

The processor may be configured to compare a power of the first signal to a power of the second signal to determine a power ratio, and adjust the tuning state based on the power ratio.

The processor may be configured to adjust the tuning state to reduce the power ratio.

The electronic device may comprise an additional transmitter coupled to the combiner and the processor. The additional transmitter may be configured to adjust a power or frequency of the first signal.

The electronic device may comprise an additional receiver coupled to the splitter and the processor. The additional receiver may be configured to adjust a power or frequency of the second combined signal.

The processor may be configured to apply a spreading code to the first signal to generate a spreaded signal having wider bandwidth and lower power than the first signal.

The processor may be configured to remove the spreading code from the second combined signal to generate the second signal. The second signal may have a narrow bandwidth and higher power than the spreaded signal.

In an embodiment, a method comprises configuring, via processing circuitry, a tunable component of a duplexer with a tuning state; combining, at an input of the duplexer, a first signal with an uplink signal to generate a first combined signal; receiving, at an output of the duplexer, a second combined signal comprising a second signal and a downlink signal; and adjusting, via the processing circuitry, the tuning state based on the first signal and the second signal.

The method may comprise receiving an indication of a transmission frequency to transmit the uplink signal and a receive frequency to receive the downlink signal, wherein the tuning state corresponds to the transmission frequency and the receive frequency.

The method may comprise receiving multiple measurements of the second combined signal.

The method may comprise averaging the multiple measurements to determine the second signal in the second combined signal.

Averaging the multiple measurements may increase power of the second signal compared to the downlink signal in the second combined signal.

The first signal may comprise a single tone.

The first signal may comprise multiple tones.

In an embodiment, a radio frequency front end comprises an antenna configured to receive a downlink signal; a receiver; a transmitter configured to transmit an uplink signal; a duplexer coupled to the receiver and the transmitter, the duplexer comprising a tunable component having a plurality of tuning states; and a processor coupled to the receiver, the transmitter, and the duplexer. The processor is configured to combine an input pilot tone with the uplink signal to generate a first combined signal, the input pilot tone have less power than the uplink signal, receive a second combined signal comprising an output pilot tone and the downlink signal, and adjust the tunable component based on the input pilot tone and the output pilot tone.

The processor may be configured to compare a power of the input pilot tone to a power of the output pilot tone to determine a power ratio, and adjust the tunable component based on the power ratio.

The processor may be configured to adjust the tunable component to reduce the power ratio.

The input pilot tone may comprise an orthogonal frequency-division modulation (OFDM) signal.

The input pilot tone may comprise a single tone of the OFDM.

The input pilot tone may comprise multiple tones of the OFDM.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users).

The invention claimed is:

1. An electronic device, comprising:
a memory configured to store a tuning state;
an antenna configured to receive a first signal;
a receiver;
a duplexer comprising a tunable component having a plurality of tuning states;
a combiner coupled to the antenna and the duplexer;
a splitter coupled to the duplexer and the receiver; and
a processor coupled to the combiner and the splitter, the processor configured to
combine a second signal with the first signal at the combiner to generate a combined signal,
receive the combined signal at the splitter, and
adjust the tuning state based on the combined signal.

2. The electronic device of claim 1, wherein the processor is configured to detect a third signal corresponding to the second signal in the combined signal.

3. The electronic device of claim 2, wherein the processor is configured to compare a power of the second signal to a power of the third signal to determine a power difference, and adjust the tuning state based on the power difference.

4. The electronic device of claim 3, wherein the processor is configured to adjust the tuning state to reduce the power difference.

5. The electronic device of claim 1, comprising an additional receiver coupled to the splitter and the processor, the additional receiver configured to adjust a power or frequency of the combined signal.

6. The electronic device of claim 1, wherein the processor is configured to apply a spreading code to the second signal to generate a spreaded signal having a wider bandwidth and lower power than the first signal.

7. The electronic device of claim 6, wherein the processor is configured to remove the spreading code from the combined signal to generate a third signal corresponding to the second signal having a narrow bandwidth and higher power than the spreaded signal.

8. The electronic device of claim 6, wherein the spreading code comprises a Gold code, a Walsh code, a code-division multiple access code, or a pseudo-random noise sequence.

9. A method, comprising:
configuring, via processing circuitry, a tunable component of a duplexer with a tuning state;
combining, at an input of the duplexer, a first signal with a second signal to generate a combined signal;
receiving, at an output of the duplexer, the combined signal; and
adjusting, via the processing circuitry, the tuning state based on the combined signal.

10. The method of claim 9, comprising receiving multiple measurements of the combined signal.

11. The method of claim 10, comprising averaging the multiple measurements to determine the second signal in the combined signal.

12. The method of claim 11, wherein the averaging increases a power of the second signal compared to the first signal in the combined signal.

13. The method of claim 9, wherein the second signal comprises a single tone.

14. The method of claim 9, wherein the second signal comprises multiple tones.

15. A tangible, non-transitory computer-readable medium, comprising computer-readable instructions that, when executed by processing circuitry, are configured to cause the processing circuitry to:
combine a second signal with a first signal at a combiner to generate a combined signal, the combiner coupled to an antenna and a duplexer;
receive the combined signal at a splitter, the splitter coupled to the duplexer and a receiver; and adjust a tunable component of the duplexer based on the combined signal.

16. The tangible, non-transitory computer-readable medium of claim 15, wherein the instructions, when executed by the processing circuitry, are configured to cause the processing circuitry to detect a third signal corresponding to the second signal in the combined signal.

17. The tangible, non-transitory computer-readable medium of claim 16, wherein the instructions, when executed by the processing circuitry, are configured to cause the processing circuitry to compare a power of the second signal to a power of the third signal to determine a power difference, and adjust the tunable component based on the power difference.

18. The tangible, non-transitory computer-readable medium of claim 17, wherein the instructions, when executed by the processing circuitry, are configured to cause the processing circuitry to adjust the tunable component to reduce the power difference.

19. The tangible, non-transitory computer-readable medium of claim 15, wherein the second signal comprises an orthogonal frequency-division modulation (OFDM) signal.

20. The tangible, non-transitory computer-readable medium of claim 19, wherein the second signal comprises multiple tones of the OFDM signal.

* * * * *